(12) United States Patent
Kadoshima et al.

(10) Patent No.: US 10,475,883 B2
(45) Date of Patent: Nov. 12, 2019

(54) SEMICONDUCTOR DEVICE AND METHOD OF MANUFACTURING THEREOF

(71) Applicant: Renesas Electronics Corporation, Koutou-ku, Tokyo (JP)

(72) Inventors: Masaru Kadoshima, Tokyo (JP); Masahiko Fujisawa, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 142 days.

(21) Appl. No.: 15/836,889

(22) Filed: Dec. 10, 2017

(65) Prior Publication Data

US 2018/0182850 A1    Jun. 28, 2018

(30) Foreign Application Priority Data

Dec. 28, 2016    (JP) ................ 2016-255683

(51) Int. Cl.
| | |
|---|---|
| *H01L 27/12* | (2006.01) |
| *H01L 29/78* | (2006.01) |
| *H01L 29/66* | (2006.01) |
| *H01L 29/08* | (2006.01) |
| *H01L 23/522* | (2006.01) |
| *H01L 21/762* | (2006.01) |

(Continued)

(52) U.S. Cl.
CPC ...... *H01L 29/0847* (2013.01); *H01L 21/0265* (2013.01); *H01L 21/76283* (2013.01); *H01L 21/76802* (2013.01); *H01L 21/76897* (2013.01); *H01L 21/84* (2013.01); *H01L 23/5226* (2013.01); *H01L 27/1203* (2013.01); *H01L 29/41733* (2013.01); *H01L 29/66772* (2013.01); *H01L 29/78618* (2013.01); *H01L 29/78624* (2013.01); *H01L 29/78654* (2013.01); *H01L 21/0262* (2013.01); *H01L 21/02532* (2013.01); *H01L 21/02647* (2013.01)

(58) Field of Classification Search
CPC ......... H01L 29/66772; H01L 29/78654; H01L 29/78624; H01L 29/78618; H01L 29/76857; H01L 29/41733; H01L 29/6678; H01L 21/84; H01L 21/02647; H01L 21/0265; H01L 21/76897; H01L 27/1203; H01L 23/5226
See application file for complete search history.

(56) References Cited

U.S. PATENT DOCUMENTS

| | | | |
|---|---|---|---|
| 9,887,211 B2 * | 2/2018 | Yamamoto | ......... H01L 27/1203 |
| 2012/0056245 A1 * | 3/2012 | Kang | ................. H01L 21/0245 257/192 |

(Continued)

FOREIGN PATENT DOCUMENTS

JP      2014-236097 A      12/2014

*Primary Examiner* — Michael M Trinh
(74) *Attorney, Agent, or Firm* — Shapiro, Gabor and Rosenberger, PLLC

(57) ABSTRACT

In a semiconductor device, a width of a second epitaxial layer is greater than a width of a first epitaxial layer, and a thickness of an end portion of the second epitaxial layer, which is in contact with an element isolation portion, is smaller than a thickness of an end portion of the first epitaxial layer, which is in contact with the element isolation portion, and a second shortest distance between the element isolation portion and a second plug is greater than a first shortest distance between the element isolation portion and a first plug.

15 Claims, 21 Drawing Sheets

(51) Int. Cl.
     *H01L 21/768*    (2006.01)
     *H01L 21/02*     (2006.01)
     *H01L 21/84*     (2006.01)
     *H01L 29/786*    (2006.01)
     *H01L 29/417*    (2006.01)

(56) References Cited

U.S. PATENT DOCUMENTS

| | | |
|---|---|---|
| 2014/0353756 A1 | 12/2014 | Yamamoto |
| 2015/0364490 A1* | 12/2015 | Oda ................. H01L 21/26513 257/351 |
| 2016/0013207 A1* | 1/2016 | Makiyama .......... H01L 27/1207 257/350 |
| 2016/0099251 A1* | 4/2016 | Yamamoto .............. H01L 21/84 257/350 |
| 2017/0110569 A1* | 4/2017 | Chang ............... H01L 21/76807 |

* cited by examiner

<STEP>

<KINK>

US 10,475,883 B2

SEMICONDUCTOR DEVICE AND METHOD OF MANUFACTURING THEREOF

CROSS-REFERENCE TO RELATED APPLICATION

The present application claims priority from Japanese Patent Application No. 2016-255683 filed on Dec. 28, 2016, the content of which is hereby incorporated by reference into this application.

TECHNICAL FIELD OF THE INVENTION

The present invention relates to a semiconductor device and a manufacturing technique thereof, for example, a technique effectively applied to a semiconductor device in which a field effect transistor is formed on an SOI (Silicon On Insulator) substrate and a manufacturing technique thereof.

BACKGROUND OF THE INVENTION

Japanese Patent Application Laid-Open Publication No. 2014-236097 (Patent Document 1) discloses a technique in which an epitaxial layer formed on a semiconductor layer in an upper part of an SOI substrate is formed to have a large width so as to cover an end portion of an upper surface of an element isolation portion adjacent to the semiconductor layer.

SUMMARY OF THE INVENTION

For example, a source region and a drain region of a field effect transistor are formed in a semiconductor layer of an SOI substrate and plugs are respectively connected to the source region and the drain region in some cases. In this case, a formation position of the plug sometimes deviates from the semiconductor layer of the SOI substrate toward the element isolation portion adjacent to the semiconductor layer depending on alignment accuracy of the photolithography technique.

At this time, if the interlayer insulating film and the element isolation portion are made of the same material, the element isolation portion is also etched when the interlayer insulating film is etched to form the plug, and there is a possibility that the plug reaches a support substrate of the SOI substrate. Consequently, the field effect transistor formed on the semiconductor layer of the SOI substrate and the support substrate of the SOI substrate are electrically connected to each other, so that the field effect transistor may not operate properly.

Therefore, in the technique of forming the field effect transistor on the semiconductor layer of the SOI substrate, it is desired to devise an ingenuity to prevent the electrical conduction between the plug and the support substrate of the SOI substrate even when the formation position of the plug deviates.

Other problems and novel features will be apparent from the description of the present specification and the attached drawings.

In a semiconductor device according to an embodiment, a width of a second epitaxial layer is greater than a width of a first epitaxial layer, a thickness of an end portion of the second epitaxial layer, which is in contact with an element isolation portion, is smaller than a thickness of an end portion of the first epitaxial layer, which is in contact with the element isolation portion, and a shortest distance between the element isolation portion and a second plug is greater than a shortest distance between the element isolation portion and a first plug.

According to the embodiment, it is possible to improve the reliability of the semiconductor device.

BRIEF DESCRIPTIONS OF THE DRAWINGS

DESCRIPTIONS OF THE PREFERRED EMBODIMENTS

Figure 1:
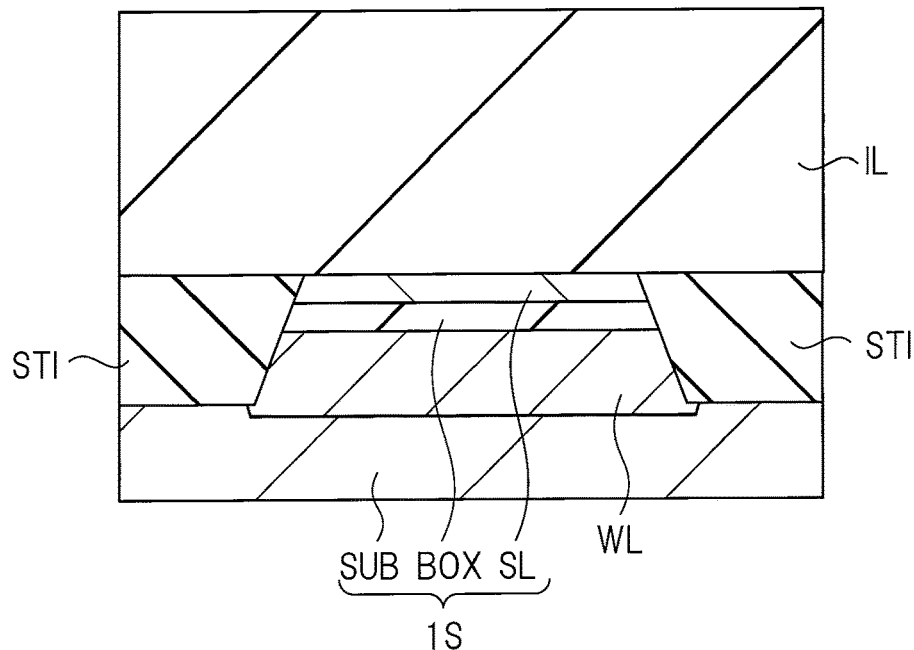
FIG. 1 is a view for describing a room for improvement particular to an SOI substrate.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, the same components are denoted by the same reference characters throughout the drawings for describing the embodiments, and the repetitive descriptions thereof are omitted. Note that hatching is used even in a plan view so as to make the drawings easy to see.

First Embodiment

<Examination of Improvement>

For the achievement of higher integration in a semiconductor device, a field effect transistor has been miniaturized based on a scaling rule. However, in the miniaturized field effect transistor, the short channel effect and the variation in the threshold voltage become apparent, with the result that the performance of the semiconductor device is degraded. In this respect, in the field effect transistor formed on an SOI substrate, the short channel effect and the variation in the threshold voltage are less likely to be apparent compared with the field effect transistor formed on a semiconductor substrate (bulk substrate), and thus the semiconductor device can deliver superior performance. Accordingly, for example, in the semiconductor device of the generation with a circuit line width of about 90 nm and subsequent generations, the technique of forming the field effect transistor on the SOI substrate is sometimes adopted.

In particular, when a fully depleted transistor is adopted as a field effect transistor formed on an SOI substrate, the fully depleted transistor is excellent from the viewpoint of suppressing the short channel effect, and can sufficiently suppress the variation in threshold voltage due to the variation in impurity because no impurity is introduced into the channel region. Accordingly, it is possible to provide the semiconductor device with excellent performance by adopting the fully depleted transistor.

However, since it is necessary to fully deplete the semiconductor layer (silicon layer) in the fully depleted transistor, it is necessary to make the semiconductor layer of the SOI substrate very thin.

In this case, the examination by the inventors of the present invention has found that the plug to be connected to the semiconductor layer of the SOI substrate penetrates through the semiconductor layer and the buried insulating layer to reach the support substrate because of the small thickness of the semiconductor layer. This point will be described below.

First, as shown in FIG. 1, an element isolation portion STI is formed in a surface of an SOI substrate 1S comprised of a support substrate SUB, a buried insulating layer BOX, and a semiconductor layer SL. Also, a well WL is formed in the support substrate SUB. Further, an interlayer insulating film IL made of, for example, a silicon oxide film is formed over the SOI substrate 1S in which the element isolation portion STI has been formed.

Figure 2:
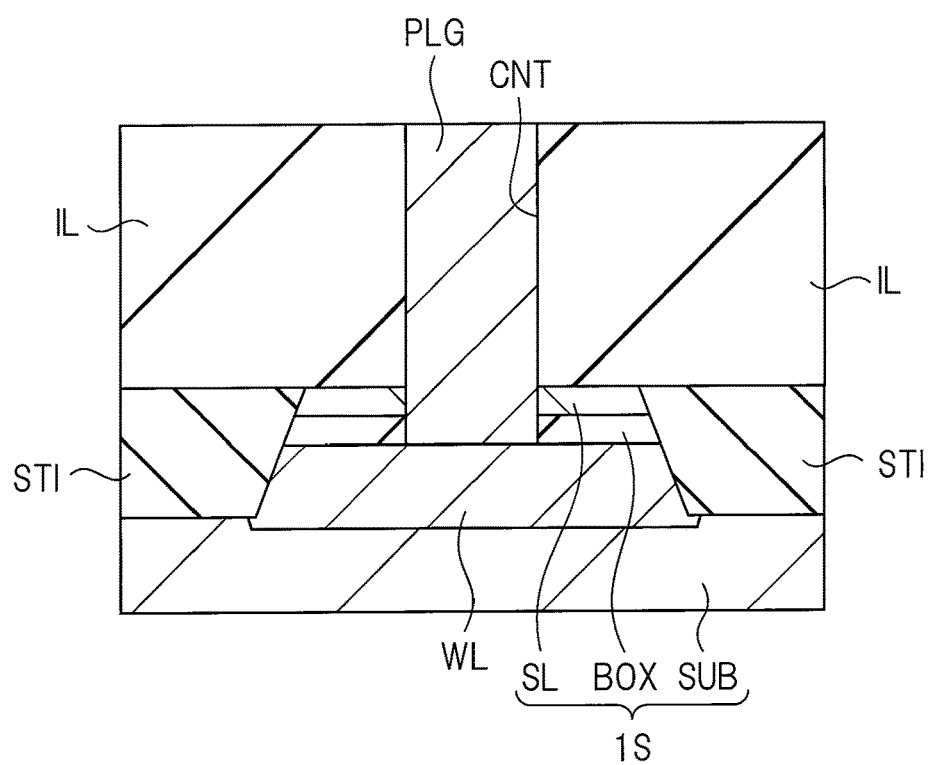
FIG. 2 is a view for describing the room for improvement particular to the SOI substrate.

Next, as shown in FIG. 2, a contact hole CNT that penetrates through the interlayer insulating film IL to reach the semiconductor layer SL of the SOI substrate 1S is formed by using the photolithography technique and the etching technique.

At this time, since the interlayer insulating film IL is made of a silicon oxide film and the semiconductor layer SL of the SOI substrate 1S is made of a silicon layer, it is considered that the semiconductor layer SL functions as an etching stopper and the etching to form the contact hole CNT in the interlayer insulating film IL stops at the time when the semiconductor layer SL is exposed.

However, according to the examination by the inventors of the present invention, for example, when the fully depleted field effect transistor is formed on the SOI substrate 1S, it is necessary to make the semiconductor layer SL very thin. In this case, if the semiconductor layer SL is very thin, the semiconductor layer SL cannot sufficiently function as an etching stopper, so that the contact hole CNT penetrates through the silicon layer SL as shown in FIG. 2. Also, since the buried insulating layer BOX formed in the lower layer of the semiconductor layer SL is made of silicon oxide that is the same material as the interlayer insulating film IL, the contact hole CNT that has penetrated through the semiconductor layer SL further penetrates through the buried insulating layer BOX.

In particular, when the configuration in which the threshold voltage of the field effect transistor formed on the semiconductor layer SL of the SOI substrate 1S is adjusted not only by the gate potential applied to the gate electrode but also by the back-gate potential applied to the well WL of the SOI substrate 1S is adopted, since it is necessary to make the buried insulating layer BOX thin, the contact hole CNT is likely to penetrate through the buried insulating layer BOX. A plug PLG is then formed by filling the contact hole CNT with a conductive material (for example, tungsten film), but if the contact hole CNT reaches the support substrate SUB as shown in FIG. 2, the semiconductor layer SL and the support substrate SUB (well WL) are electrically conducted to each other through the plug PLG. This means that the field effect transistor formed on the semiconductor layer SL and the support substrate SUB are electrically conducted, so that the field effect transistor does not operate properly.

Namely, in the configuration in which the fully depleted field effect transistor is formed on the SOI substrate 1S in particular, the semiconductor layer SL of the SOI substrate 1S is made thin. As a result, the contact hole CNT that penetrates through the interlayer insulating film IL further penetrates through the semiconductor layer SL and the buried insulating layer BOX of the SOI substrate 1S. Consequently, the plug PLG that electrically conducts the semiconductor layer SL and the support substrate SUB is formed, so that the operation failure of the field effect transistor formed on the semiconductor layer SL becomes apparent.

Figure 3:
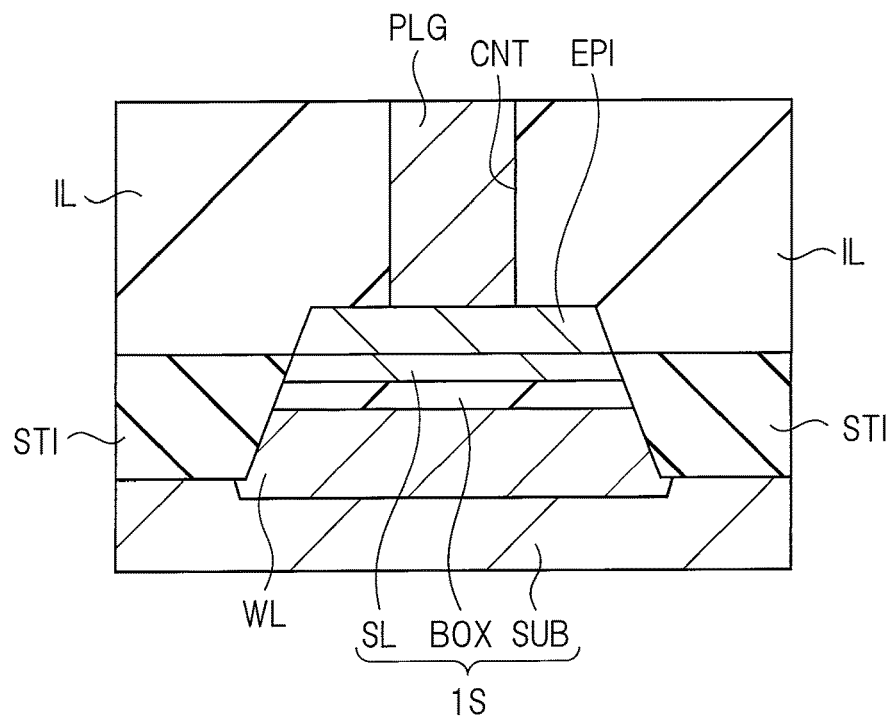
FIG. 3 is a cross-sectional view showing a case where an epitaxial layer is formed on a semiconductor layer of the SOI substrate.

In this respect, there is a technique of stacking an epitaxial layer EPI made of a silicon layer on the semiconductor layer SL of the SOI substrate 1S as shown in FIG. 3. Namely, FIG. 3 is a cross-sectional view showing the structure in which the epitaxial layer EPI is formed on the semiconductor layer SL of the SOI substrate 1S. Since the epitaxial layer EPI is formed on the semiconductor layer SL of the SOI substrate 1S as shown in FIG. 3, the thickness of an SOI layer in which the semiconductor layer SL and the epitaxial layer EPI are combined can be increased in the structure shown in FIG. 3. As a result, since the SOI layer made of silicon (semiconductor layer SL+epitaxial layer EPI) has sufficiently large thickness as shown in FIG. 3, the SOI layer sufficiently functions as an etching stopper. Therefore, the etching to form the contact hole CNT in the interlayer insulating film IL made of silicon stops on the surface of the SOI layer. In other words, as shown in FIG. 3, the electrical conduction between the semiconductor layer SL and the support substrate SUB through the plug PLG can be prevented by stacking the epitaxial layer EPI made of a silicon layer on the semiconductor layer SL of the SOI substrate 1S.

However, in the structure shown in FIG. 3 in which the epitaxial layer EPI is formed only on the semiconductor layer SL, there is a room for improvement shown below. For example, the case where the plug PLG formed in the interlayer insulating film IL deviates toward the side of the element isolation portion STI as shown in FIG. 4 is assumed.

Figure 4:
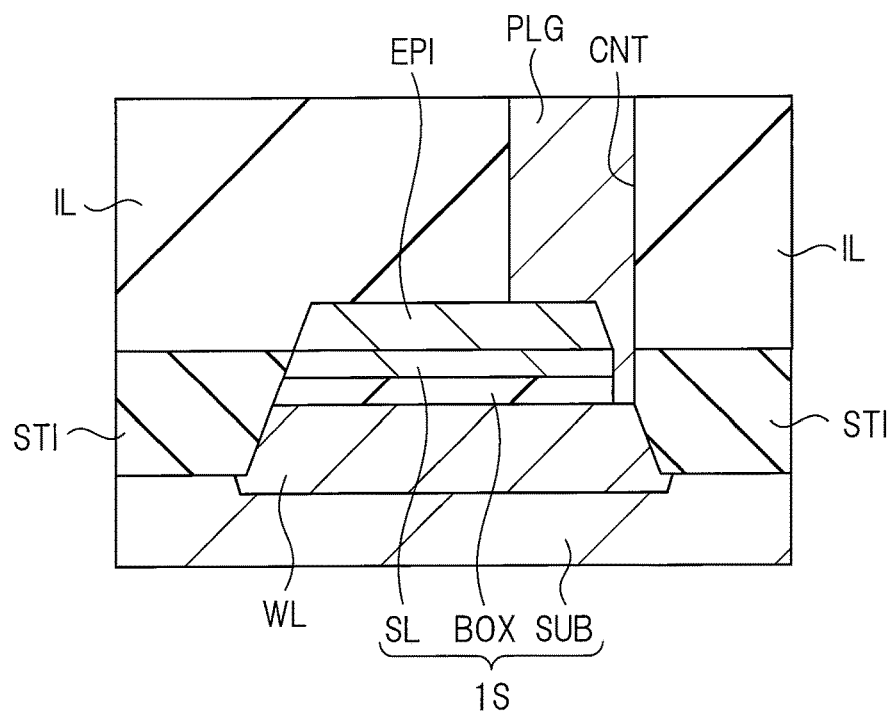
FIG. 4 is a view for describing a room for improvement in the structure shown in FIG. 3.

First, as shown in FIG. 4, at an end portion of the epitaxial layer EPI formed on the semiconductor layer SL of the SOI substrate 1S, a "facet structure" having a tapered shape is formed due to the epitaxial growth method. As a result, as shown in FIG. 4, in the "facet structure" formed at the end portion of the epitaxial layer EPI, the thickness of the epitaxial layer EPI is gradually reduced as it approaches the element isolation portion STI. Therefore, for example, when the contact hole CNT formed in the interlayer insulating film IL deviates toward the side of the element isolation portion STI as shown in FIG. 4, the contact hole CNT is formed at a part of the "facet structure" in which the thickness of the epitaxial layer EPI is small. At this time, the thickness of the epitaxial layer EPI is small at the part of the "facet structure", and therefore, at the end portion of the epitaxial layer EPI in the vicinity of the element isolation portion STI, the SOI layer in which the epitaxial layer EPI and the semiconductor layer SL are combined does not sufficiently function as an etching stopper for the etching to form the contact hole CNT. Therefore, as shown in FIG. 4, when the contact hole CNT deviates toward the side of the element isolation portion STI, the penetration of the contact hole CNT through the semiconductor layer SL and the buried insulating layer BOX occurs at the part of the "facet structure" in the vicinity of the element isolation portion STI.

Accordingly, in the structure shown in FIG. 3 (FIG. 4) in which the epitaxial layer EPI is formed only on the semiconductor layer SL, the penetration of the contact hole CNT through the semiconductor layer SL and the buried insulating layer BOX occurs when the formation position of the contact hole CNT deviates toward the side of the element isolation portion STI. As a result, the semiconductor layer SL and the support substrate SUB are electrically conducted through the plug PLG as shown in FIG. 4.

As described above, in the structure in which the epitaxial layer EPI is formed only on the semiconductor layer SL, when the formation position of the contact hole CNT deviates toward the side of the element isolation portion STI, it is not possible to suppress the electrical conduction between the semiconductor layer SL and the support substrate SUB through the plug PLG due to the "facet structure" formed at the end portion of the epitaxial layer EPI.

Figure 5:
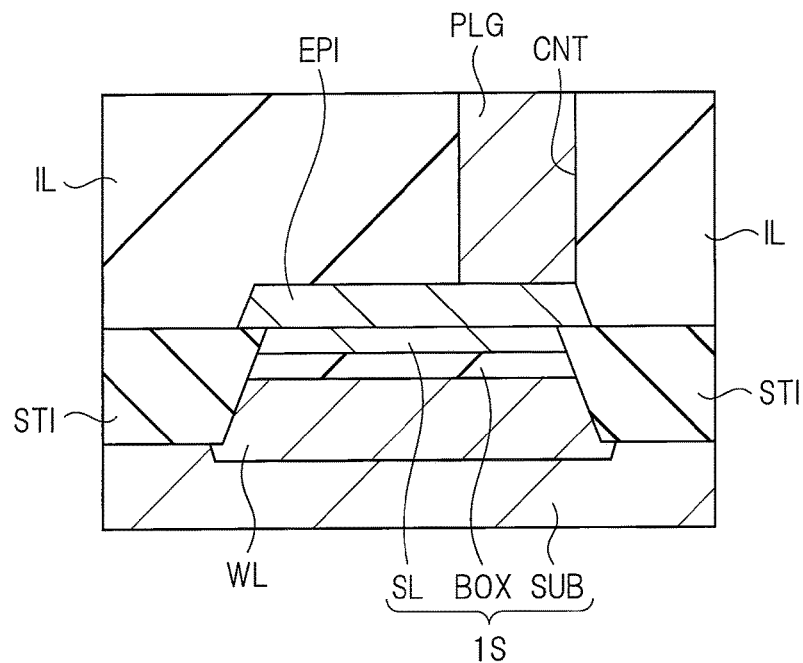
FIG. 5 is a view showing an ingenuity devised to the room for improvement in FIG. 4.

In this respect, for example, the ingenuity shown in FIG. 5 is conceivable. FIG. 5 is a cross-sectional view showing the structure in which the epitaxial layer EPI is formed so as to cover not only the semiconductor layer SL but also a part of the element isolation portion STI. In the structure shown in FIG. 5, the epitaxial layer EPI is formed not only on the semiconductor layer SL of the SOI substrate 1S but also on a part of the element isolation portion STI beyond the boundary between the semiconductor layer SL and the element isolation portion STI. Namely, in the structure shown in FIG. 5, the "facet structure" formed at the end portion of the epitaxial layer EPI is not formed on the semiconductor layer SL but is formed on the element isolation portion STI. As a result, in the structure shown in FIG. 5, the thickness of the SOI layer in which the semiconductor layer SL and the epitaxial layer EPI are combined can be sufficiently ensured even at the end portion of the semiconductor layer SL in the vicinity of the element isolation portion STI. Accordingly, in the structure shown in FIG. 5, even when the formation position of the contact hole CNT deviates toward the side of the element isolation portion STI, since the thickness of the SOI layer (semiconductor layer SL+epitaxial layer EPI) at the end portion of the semiconductor layer SL is sufficiently large, the SOI layer sufficiently functions as an etching stopper for the etching to form the contact hole CNT even at the end portion of the semiconductor layer SL.

Therefore, as shown in FIG. 5, even when the formation position of the contact hole CNT deviates toward the side of the element isolation portion STI, the electrical conduction between the semiconductor layer SL and the support substrate SUB through the plug PLG can be prevented. Namely, in the structure shown in FIG. 5, the penetration of the contact hole CNT through the semiconductor layer SL and the buried insulating layer BOX can be effectively prevented even if the case where the formation position of the contact hole CNT deviates toward the side of the element isolation portion STI is taken into account. Accordingly, in the structure shown in FIG. 5, the operation failure of the field effect transistor due to the electrical conduction between the semiconductor layer SL and the support substrate SUB through the plug PLG can be effectively suppressed.

<New Finding Discovered by Inventors of Present Invention>

As described above, the penetration of the plug PLG to the support substrate SUB can be basically prevented by adopting the structure shown in FIG. 5 in which the epitaxial layer EPI is formed so as to cover not only the semiconductor layer SL but also a part of the element isolation portion STI, with the inclusion of the case where the formation position of the contact hole CNT deviates toward the side of the element isolation portion STI. Namely, it is considered that the operation failure of the field effect transistor due to the electrical conduction between the semiconductor layer SL and the support substrate SUB through the plug PLG can be effectively suppressed by the structure shown in FIG. 5.

However, the inventors of the present invention have discovered the new finding that the case where the electrical conduction between the semiconductor layer SL and the support substrate SUB through the plug PLG cannot be always prevented when the formation position of the contact hole CNT deviates toward the side of the element isolation portion STI occurs even if the structure shown in FIG. 5 is adopted. Hereinafter, the new finding discovered by the inventors of the present invention will be described.

First, as a premise for describing the new finding discovered by the inventors of the present invention, active regions of various sizes defined by the element isolation portion STI are present in the SOI substrate. Namely, though an SRAM, a logic circuit, an I/O circuit and others are formed in the semiconductor chip, sizes of the active regions in which these circuits are formed are different depending on the type of the circuits. Therefore, active regions of various sizes corresponding to various circuits are present in the semiconductor chip. Hereinafter, the new finding discovered by the inventors of the present invention will be described based on this premise.

Figure 6:
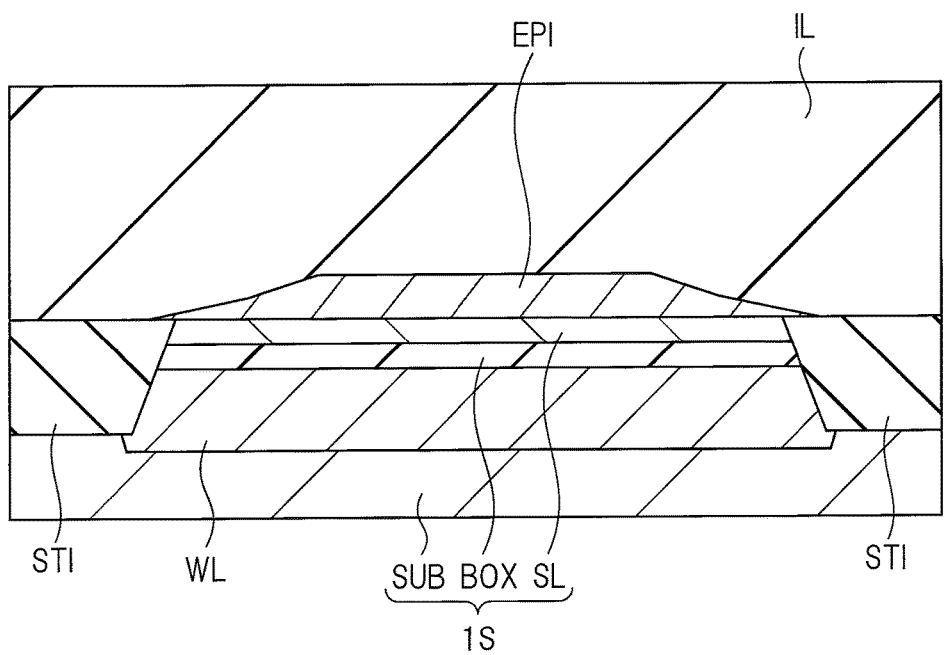
FIG. 6 is a view for describing a new finding discovered by the inventors of the present invention.

FIG. 6 is a view for describing the new finding discovered by the inventors of the present invention. As shown in FIG. 6, the element isolation portion STI and the well WL are formed in the SOI substrate 1S comprised of the support substrate SUB, the buried insulating layer BOX, and the semiconductor layer SL. Further, the epitaxial layer EPI is formed over the semiconductor layer SL and a part of the element isolation portion STI. The configuration of FIG. 6 mentioned so far is the same as the configuration of FIG. 5 described above, but the end portion of the epitaxial layer EPI is formed to have a "flared structure" in the configuration shown in FIG. 6. Namely, the structure shown in FIG. 5 and the structure shown in FIG. 6 are different in that the end portion of the epitaxial layer EPI has the "facet structure" in FIG. 5 and the end portion of the epitaxial layer EPI has the "flared structure" in FIG. 6.

Here, the "facet structure" shown in FIG. 5 means a tapered shape, and particularly means an end portion shape formed by an inclined line with a steep gradient. On the other hand, the "flared structure" shown in FIG. 6 means an end portion shape formed by the combination of an inclined line with a steep gradient and an inclined line with a gentle gradient. Namely, the "flared structure" shown in FIG. 6 is an end portion shape formed by the combination of inclined lines with different gradients, and is thus different from the "facet structure" shown in FIG. 5 which is an end portion shape formed by an inclined line with a constant gradient. In particular, as the characteristics of the "flared structure", a width of the "flared structure" (in a gate width direction) is greater than a width of the "facet structure" (in the gate width direction).

In the "facet structure", the electrical conduction between the semiconductor layer SL and the support substrate SUB through the plug PLG can be prevented by adopting the structure shown in FIG. 5 even when the formation position of the contact hole CNT deviates toward the side of the element isolation portion STI. On the other hand, in the "flared structure", when the formation position of the contact hole CNT deviates toward the side of the element isolation portion STI, the electrical conduction between the semiconductor layer SL and the support substrate SUB through the plug PLG cannot be prevented even if the structure shown in FIG. 5 is adopted, due to the characteristics of the "flared structure" described above.

This point will be described below. As described above, on the premise that active regions of various sizes corresponding to various circuits are present in the semiconductor chip, the new finding discovered by the inventors of the present invention lies in that an end portion shape of the epitaxial layer EPI formed on the semiconductor layer SL in the active region varies depending on the width (W) of the active region surrounded by the element isolation portion STI.

Specifically, the new finding discovered by the inventors of the present invention is as follows. That is, the new finding lies in that the end portion shape of the epitaxial layer EPI formed on the semiconductor layer SL in the active region has the "facet structure" as shown in FIG. 5 when the width of the active region (width in the gate width direction) is small, while the end portion shape of the epitaxial layer EPI formed on the semiconductor layer SL in the active region has the "flared structure" as shown in FIG. 6 when the width of the active region is large.

Then, when the finding is taken into account, in the case where the width of the active region is small, the penetration of the contact hole CNT through the semiconductor layer SL and the buried insulating layer BOX is prevented even if the formation position of the contact hole CNT deviates toward the side of the element isolation portion STI as shown in FIG. 5, with the result that the electrical conduction between the semiconductor layer SL and the support substrate SUB through the plug PLG is avoided.

Figure 7:
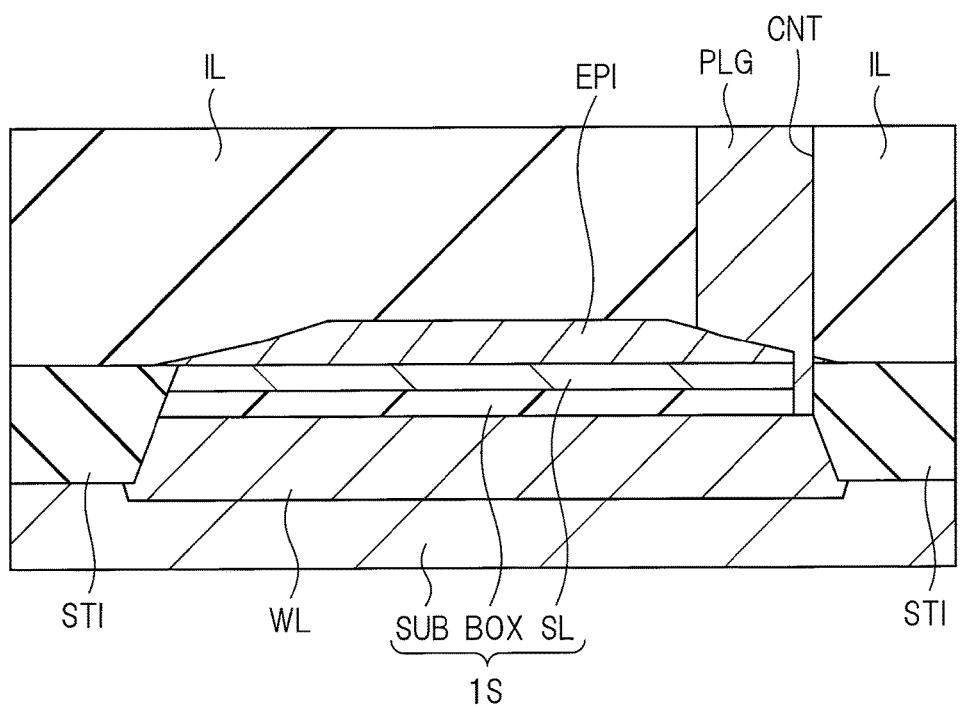
FIG. 7 is a view for describing a room for improvement in the structure shown in FIG. 6.

However, in the case where the width of the active region (width in the gate width direction) is large as shown in FIG. 6 and FIG. 7, the contact hole CNT is formed at the end portion of the epitaxial layer EPI having the "flared structure" when the formation position of the contact hole CNT deviates toward the side of the element isolation portion STI. Further, since the thickness of the SOI layer in which the semiconductor layer SL and the epitaxial layer EPI are combined is small at the location of the "flared structure", the SOI layer does not sufficiently function as an etching stopper for the etching to form the contact hole CNT. Accordingly, even if the epitaxial layer EPI is formed over the semiconductor layer SL and a part of the element isolation portion STI, as shown in FIG. 7, the "flared structure" with a small thickness is formed on the semiconductor layer SL due to the characteristics that the width of the "flared structure" is increased. Consequently, in the case where the "flared structure" is formed at the end portion of the epitaxial layer EPI, the penetration of the contact hole CNT through the semiconductor layer SL and the buried insulating layer BOX occurs when the formation position of the contact hole CNT deviates toward the side of the element isolation portion STI. Therefore, in the structure shown in FIG. 7 in which the "flared structure" is formed, the electrical conduction between the semiconductor layer SL and the support substrate SUB through the plug PLG occurs even if the epitaxial layer EPI is formed over the semiconductor layer SL and a part of the element isolation portion STI.

<Details of Finding>

The new finding discovered by the inventors of the present invention lies in that the end portion shape of the epitaxial layer EPI formed on the semiconductor layer SL in the active region varies depending on the width (W) of the active region surrounded by the element isolation portion STI. Qualitatively, the new finding discovered by the inventors of the present invention lies in that the end portion shape of the epitaxial layer EPI has the "facet structure" when the width of the active region is small, while the end portion shape of the epitaxial layer EPI has the "flared structure" when the width of the active region is large.

Figure 8A:
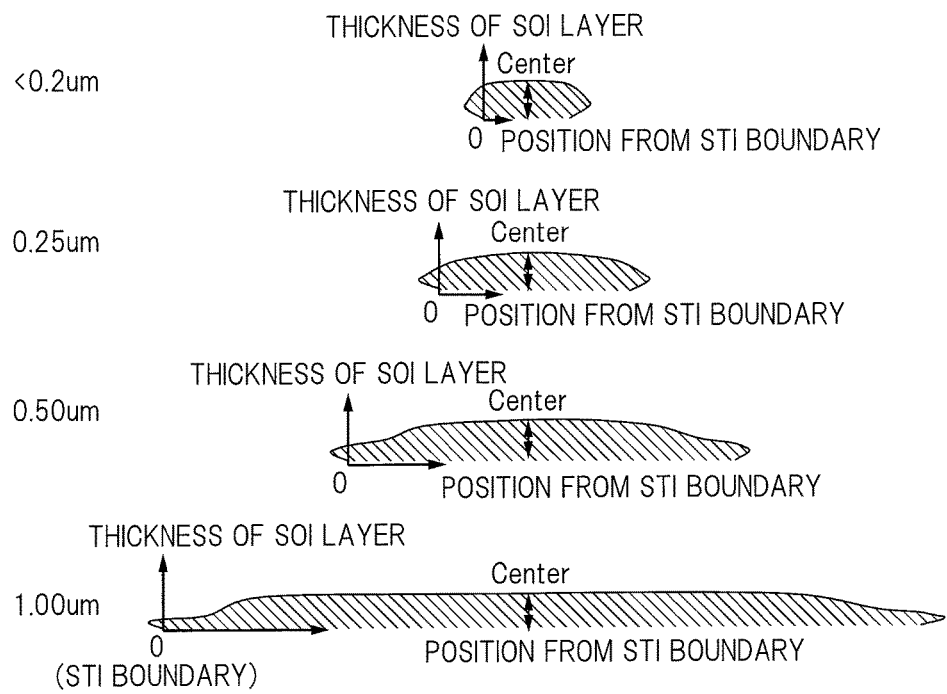
FIG. 8A is a view schematically showing a change in a shape of an SOI layer (semiconductor layer+epitaxial layer) in the case where a width of an active region (gate width direction) is changed.

Hereinafter, details of the new finding discovered by the inventors of the present invention will be described. FIG. 8A a view schematically showing a change in the shape of the SOI layer (semiconductor layer SL+epitaxial layer EPI) in the case where a width of an active region (gate width direction) is changed, and FIG. 8B is a graph showing a relation between the width of the active region (W) and a thickness of the SOI layer (thickness of semiconductor layer SL+epitaxial layer EPI).

First, in FIG. 8A, it can be seen that when the width of the active region is 0.2 μm or smaller, the end portion shape of the SOI layer has the "facet structure". Also, it can be seen that when the width of the active region becomes 0.25 μm, the end portion shape of the SOI layer becomes a more gentle "facet structure" than the "facet structure" of the case where the width of the active region is 0.2 μm. In addition, it can be seen that when the width of the active region becomes 0.5 μm, the end portion shape of the SOI layer becomes the "flared structure", and when the width of the active region becomes 1.0 μm, the end portion shape of the SOI layer becomes the further "flared structure". Therefore, when the results of FIG. 8A are taken into account, it can be seen that when the width of the active region is 0.25 μm or smaller, the end portion shape of the SOI layer generally has the "facet structure", and when the width of the active region is greater than 2.5 μm, the end portion shape of the SOI layer becomes the "flared structure". Namely, when the new finding discovered by the inventors of the present invention is qualitatively evaluated based on the results of FIG. 8A, it can be said that the end portion shape changes from the "facet structure" to the "flared structure" with the width of the active region of about 0.25 μm as the boundary. Accordingly, in the case where the width of the active region is 0.25 μm or smaller, the penetration of the contact hole CNT through the semiconductor layer SL and the buried insulating layer BOX is suppressed by adopting the structure shown in FIG. 5 even if the formation position of the contact hole CNT deviates toward the side of the element isolation portion STI, so that the electrical conduction between the semiconductor layer SL and the support substrate SUB through the plug PLG can be prevented.

On the other hand, in the case where the width of the active region becomes greater than 0.25 μm, when the formation position of the contact hole CNT deviates toward the side of the element isolation portion STI, it is difficult to effectively prevent the penetration of the contact hole CNT through the semiconductor layer SL and the buried insulating layer BOX even if the structure shown in FIG. 5 is adopted, and there is a possibility that the semiconductor layer SL and the support substrate SUB are electrically conducted through the plug PLG. Thus, it can be seen that when the width of the active region is greater than 0.25 μm, an alternative ingenuity to the structure shown in FIG. 5 is necessary from the viewpoint of preventing the penetration of the contact hole CNT through the semiconductor layer SL and the buried insulating layer BOX.

Figure 8B:
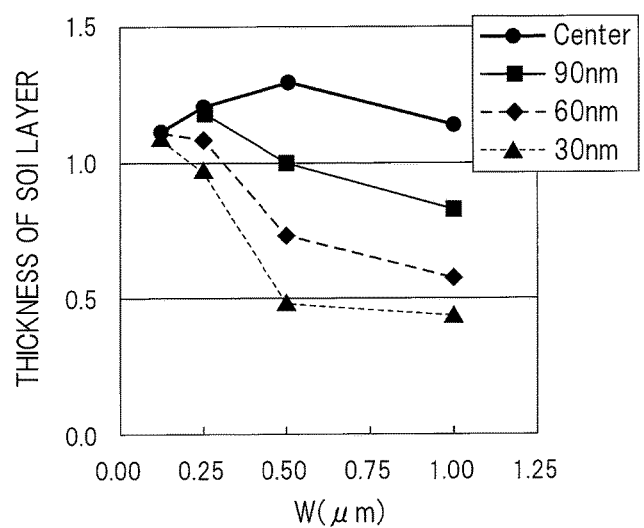
FIG. 8B is a graph showing a relation between a width of the active region (W) and a thickness of the SOI layer (thickness of semiconductor layer+epitaxial layer)

Next, in FIG. 8B, the horizontal axis represents the width of the active region (gate width direction: W μm) and the vertical axis represents the ratio of the thickness of the SOI layer. Note that the thickness of the SOI layer mentioned here corresponds to the value obtained by adding the thickness of the semiconductor layer SL and the thickness of the epitaxial layer EPI. Further, in FIG. 8B, "circle mark" indicates the thickness of the SOI layer at the center of the epitaxial layer EPI, and "square mark" indicates the thickness of the SOI layer at the position only 90 nm away from the boundary between the support substrate SUB and the element isolation portion STI. Also, "diamond mark" indicates the thickness of the SOI layer at the position only 60 nm away from the boundary between the support substrate SUB and the element isolation portion STI, and "triangle mark" indicates the thickness of the SOI layer at the position only 30 nm away from the boundary between the support substrate SUB and the element isolation portion STI.

As can be seen from FIG. 8B, in the case where the width of the active region is smaller than 0.25 μm, the "circle mark", the "square mark", the "diamond mark", and the "triangle mark" are almost overlapped with each other, and this means that the thickness of the SOI layer at the center is almost equal to the thickness of the SOI layer at each position only 30 to 90 nm away from the boundary between the support substrate SUB and the element isolation portion STI.

Meanwhile, as the width of the active region becomes greater from 0.25 μm, the "circle mark", the "square mark", the "diamond mark", and the "triangle mark" are separated from each other. This means that the thickness of the SOI layer becomes smaller as it approaches from the center position of the epitaxial layer to the boundary position between the support substrate SUB and the element isolation portion STI. In other words, this means that the "flared structure" becomes apparent when the width of the active region becomes greater than 0.25 μm. In particular, it can be seen that when the width of the active region reaches 1.0 μm, the thickness of the SOI layer at the position only 30 nm away from the boundary between the support substrate SUB and the element isolation portion STI is reduced to about half of the thickness at the center position of the epitaxial layer. Accordingly, it can be seen that the "flared structure" becomes apparent as the width of the active region becomes greater. Therefore, it can be said that the graph of FIG. 8B shows that as the width of the active region becomes greater, the penetration of the contact hole CNT through the semiconductor layer SL and the buried insulating layer BOX is more likely to occur when the formation position of the contact hole CNT deviates toward the side of the element isolation portion STI.

Then, the question arises as to why the end portion shape of the epitaxial layer changes from the "facet structure" to the "flared structure" when the width of the active region increases. As to this point, the intensive examination and analysis by the inventors of the present invention have found out that the "flared structure" is resumed to be formed by the mechanism shown below, and this mechanism will be described below.

<Mechanism to "Form Flared Structure">

Figure 9:
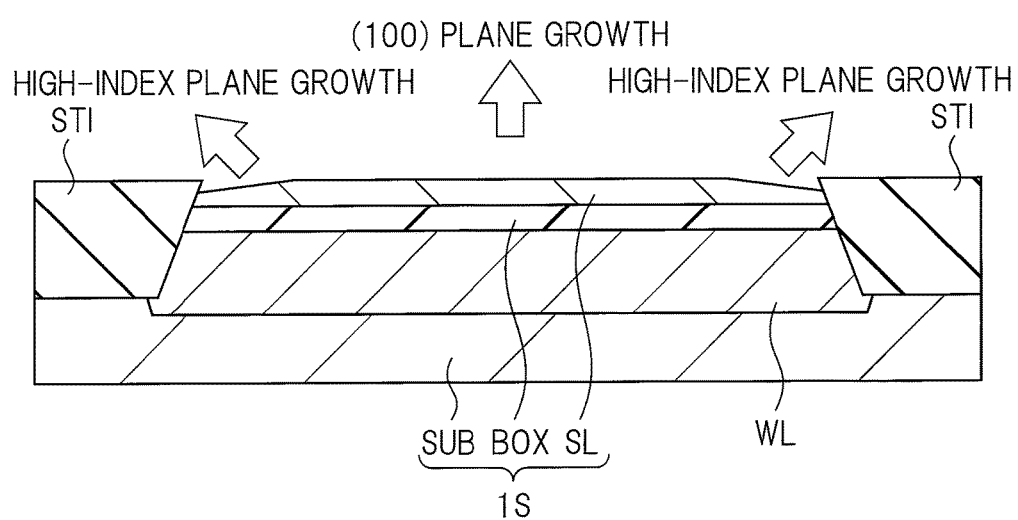
FIG. 9 is a view showing a growth plane when an epitaxial layer is grown on a semiconductor layer of an SOI substrate by the epitaxial growth method.

FIG. 9 is a view showing a growth plane when an epitaxial layer is grown on the semiconductor layer SL of the SOI substrate 1S by the epitaxial growth method. As shown in FIG. 9, in the vicinity of the center part of the semiconductor layer SL, the epitaxial layer is grown on the semiconductor layer SL along a (100) plane. This is because the surface of the semiconductor layer SL which is the underlying base of the epitaxial layer is the (100) plane, and the epitaxial layer is grown on the (100) plane of the semiconductor layer SL.

On the other hand, in the vicinity of the end portion of the semiconductor layer SL, the epitaxial layer is grown on the semiconductor layer SL along a high-index plane such as a (111) plane. This is because since the end portion of the semiconductor layer SL is rounded or inclined so as to reduce the film thickness thereof as schematically shown in FIG. 9, a high-index plane different from a (100) plane is exposed as an inclined surface, and the epitaxial layer is grown on the high-index plane in the vicinity of the end portion of the semiconductor layer SL.

Note that the reason why the end portion of the semiconductor layer SL has a rounded or inclined shape is that the shape of the end portion of the semiconductor layer SL is likely to change in the process of oxidizing the semiconductor layer SL and the process of removing the oxide film before forming the epitaxial layer. For example, when the element isolation portion STI is recessed down from the surface of the semiconductor layer SL, the side surface of the semiconductor layer SL is exposed, and thus the shape of the end portion of the semiconductor layer SL is more susceptible to the influence of such processes. Namely, the end portion of the semiconductor layer SL is more susceptible to the influence of such processes (oxidation process and oxide film removing process) in comparison to the center part, and thus has a rounded or inclined shape.

As described above, the plane orientation of the exposed surface of the semiconductor layer SL serving as the underlying base of the epitaxial growth differs between the vicinity of the center part and the vicinity of the end portion of the semiconductor layer SL. Further, the inventors of the present invention have newly found out that the "flared structure" is formed due to the difference between the plane orientation of the growth plane of the epitaxial layer in the vicinity of the center part of the semiconductor layer SL and the plane orientation of the growth plane of the epitaxial layer in the vicinity of the end portion of the semiconductor layer SL.

Specifically, there are a large number of parts referred to as "step" and parts referred to as "kink" in the epitaxial layer using the (100) plane as the growth plane. These are mainly made of dangling bonds of silicon. On the other hand, in the epitaxial layer using the high-index plane as the growth plane, there are a small number of parts referred to as "step" and parts referred to as "kink". Thus, the "flared structure" is formed due to the fact that there are a large number of parts referred to as "step" and parts referred to as "kink" on the (100) plane, while there are a small number of parts referred to as "step" and parts referred to as "kink" on the high-index plane.

Hereinafter, the mechanism to form the "flared structure" depending on the difference in the number of parts referred to as "step" and parts referred to as "kink" will be described.

Figure 10:
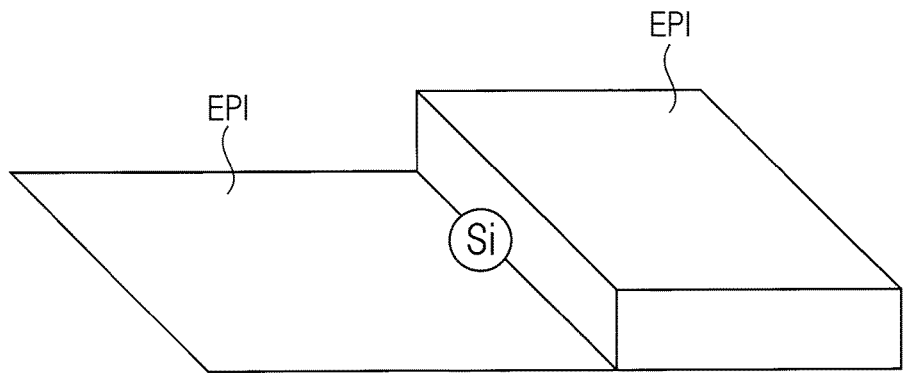
FIG. 10 is a view schematically showing a shape of "step"
Figure 11:
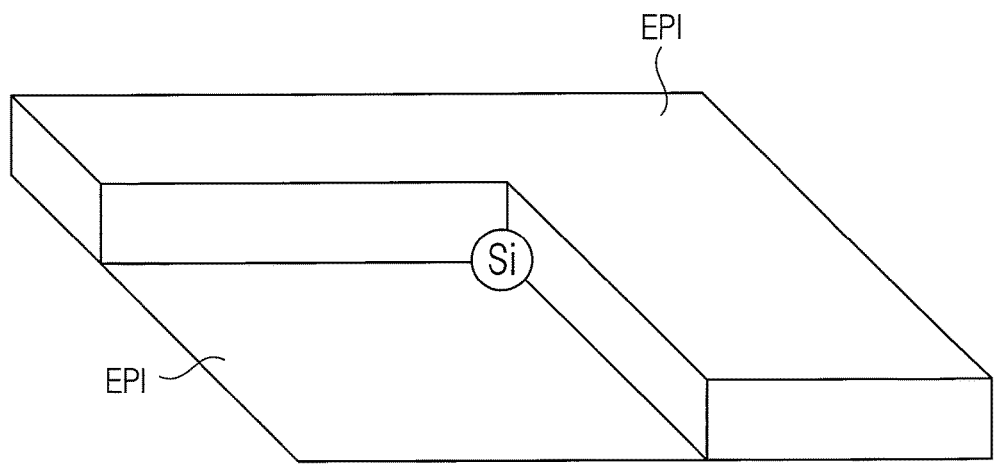
FIG. 11 is a view schematically showing a shape of "kink"

FIG. 10 is a view schematically showing a shape of the "step", and a state in which a silicon element is captured by the "step" is shown in FIG. 10. Also, FIG. 11 is a view schematically showing a shape of the "kink", and a state in which a silicon element is captured by the "kink" is shown in FIG. 11. Namely, as can be seen from FIG. 10 and FIG. 11, the silicon element to be the nucleus of the epitaxial growth is likely to be captured by the "step" and the "kink". This means that the silicon element is likely to be captured on the (100) plane having a large number of "steps" and "kinks" and there are a large number of nuclei of the epitaxial growth on the (100) plane. Accordingly, it is considered that the epitaxial growth rate on the (100) plane is high. On the other hand, the silicon element is less likely to be captured on the high-index plane having a small number of "steps" and "kinks", and this means that there are a small number of nuclei of the epitaxial growth on the high-index plane. Accordingly, it is considered that the epitaxial growth rate on the high-index plane is low.

Figure 12:
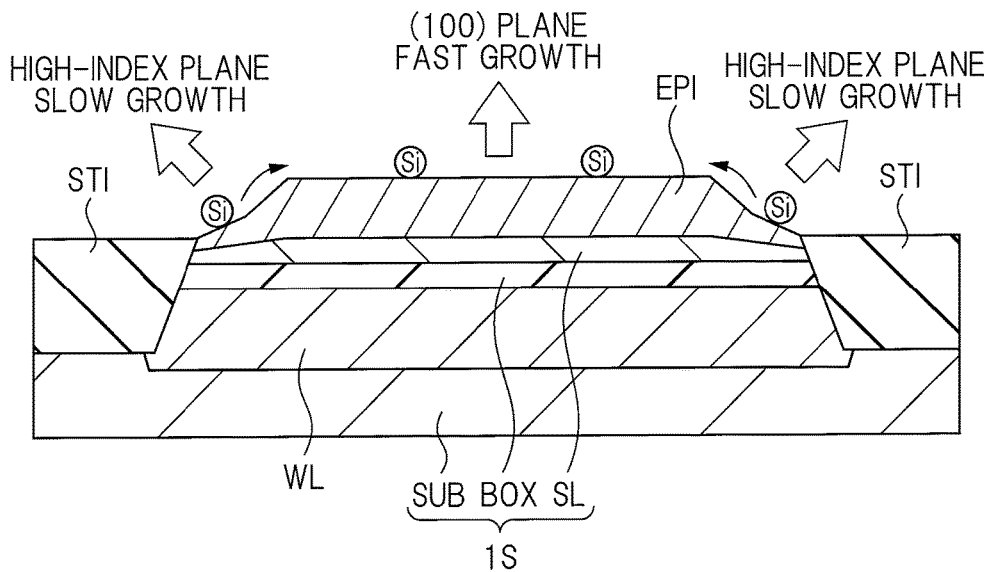
FIG. 12 is a view for describing a mechanism to form a "flared structure"

Further, as shown in FIG. 12, since there are a small number of "steps" and "kinks" on the high-index plane, the silicon elements deposited on the high-index plane are likely to migrate. On the other hand, on the (100) plane, the silicon elements migrated from the high-index plane are likely to be captured by a large number of "steps" and "kinks" present on the (100) plane. As a result, in the region in the vicinity of the center part in which the epitaxial layer is grown along the (100) plane, the epitaxial growth rate becomes high, and thus the thickness of the epitaxial layer becomes large. On the other hand, in the region in the vicinity of the end portion in which the epitaxial layer is grown along the high-index plane, there are a small number of "steps" and "kinks" serving as capturing portions of silicon element, and thus the silicon elements are likely to migrate from the vicinity of the end portion to the vicinity of the center part, so that the epitaxial growth rate becomes low and the thickness of the epitaxial layer becomes small.

Figure 13:
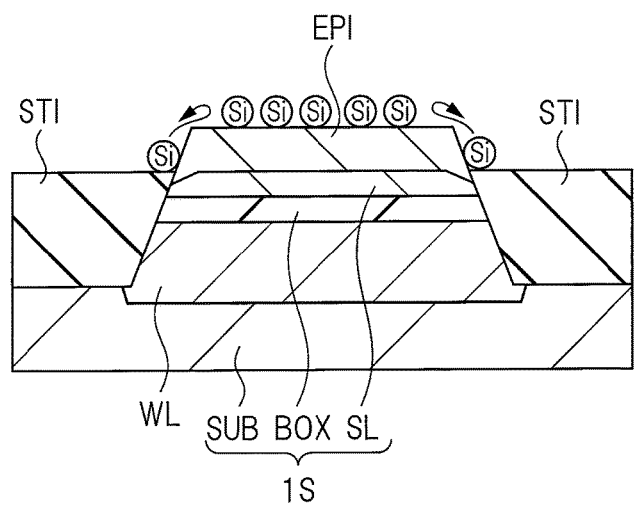
FIG. 13 is a view for describing a mechanism to form a "facet structure"

According to the mechanism described above, the "flared structure" is formed in the vicinity of the end portion of the epitaxial layer. In particular, when the active region has a large width, the ratio of the (100) plane to the high-index plane is increased, and the number of "steps" and "kinks" present on the (100) plane is inevitably increased. Therefore, it is considered that the silicon elements migrated from the high-index plane are certainly captured by "steps" and "kinks" present on the (100) plane, and thus the silicon elements are less likely to migrate to return to the high-index plane from the (100) plane. Accordingly, it is considered that when the active region has a large width, the "flared structure" is likely to be formed in the vicinity of the end portion of the epitaxial layer. On the other hand, when the active region has a small width, the ratio of the (100) plane to the high-index plane is decreased, and the number of "steps" and "kinks" present on the (100) plane is inevitably decreased. Therefore, as shown in FIG. 13, it is considered that all of the silicon elements migrated from the high-index plane to the (100) plane cannot be captured by "steps" and "kinks" present on the (100) plane and the silicon elements are overflown from the (100) plane, so that the silicon elements overflown without being captured migrate to return back to the high-index plane from the (100) plane. Accordingly, when the active region has a small width, a large number of silicon elements to be the nuclei of the epitaxial growth are present even on the high-index plane, so that the "flared structure" is less likely to be formed in the vicinity of the end portion of the epitaxial layer. According to the mechanism described above, the tendency in which the "flared structure" is less likely to be formed when the active region has a small width and the "flared structure" becomes apparent as the width of the active region becomes greater (see FIG. 8A) can be described.

In the manner described above, when the active region has a large width, the "flared structure" is formed in the region in the vicinity of the end portion of the epitaxial layer. For example, in the case where the active region has a small width and the "flared structure" is not formed, the electrical conduction between the semiconductor layer SL and the support substrate SUB through the plug PLG can be prevented by adopting the structure shown in FIG. 5 even when the formation position of the contact hole CNT deviates toward the side of the element isolation portion STI.

On the other hand, in the case where the active region has a large width and the "flared structure" is formed in the region in the vicinity of the end portion of the epitaxial layer, when the formation position of the contact hole CNT deviates toward the side of the element isolation portion STI, the electrical conduction between the semiconductor layer SL and the support substrate SUB through the plug PLG cannot be prevented even if the structure shown in FIG. 5 is adopted. Namely, in the case where the "flared structure" is formed in the region in the vicinity of the end portion of the epitaxial layer EPI, when the formation position of the contact hole CNT deviates toward the side of the element isolation portion STI, the penetration of the contact hole CNT through the semiconductor layer SL and the buried insulating layer BOX occurs.

Therefore, in the first embodiment, an ingenuity is devised to prevent the penetration of the contact hole CNT through the semiconductor layer SL and the buried insulating layer BOX even when the active region has a large width, the "flared structure" is formed in the region in the vicinity of the end portion of the epitaxial layer, and the formation position of the contact hole CNT deviates toward the side of the element isolation portion STI. Hereinafter, the technical idea of the first embodiment to which this ingenuity is applied will be described with reference to drawings.

<Configuration of Semiconductor Device>

<<Planer Configuration>>

Figure 14:
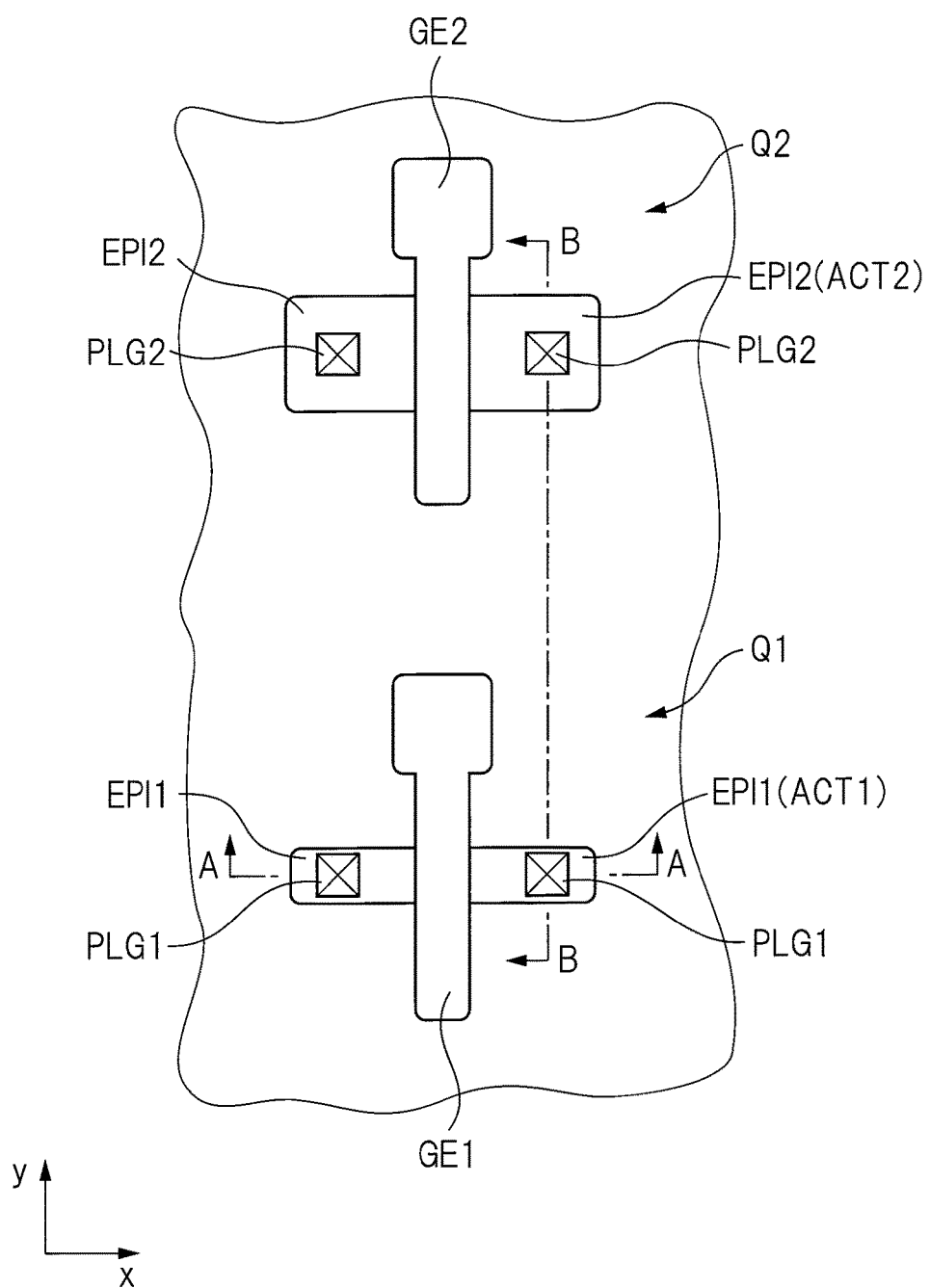
FIG. 14 is a plan view schematically showing a configuration of a semiconductor device according to a first embodiment.

FIG. 14 is a plan view schematically showing a configuration of the semiconductor device according to the first embodiment. As shown in FIG. 14, for example, the semiconductor device according to the first embodiment includes a field effect transistor Q1 and a field effect transistor Q2. For example, as shown in FIG. 14, the field effect transistor Q1 and the field effect transistor Q2 are arranged in a y direction. First, the field effect transistor Q1 is formed in an active region ACT1 having a small width in the y direction (gate width direction), and includes a gate electrode GE1 extending in the y direction across the active region ACT1 Further, the field effect transistor Q1 includes an epitaxial layer EPI1 formed on the active region ACT1 sandwiching the gate electrode GE1. Then, the epitaxial layer EPI1 is electrically connected to a plug PLG1 formed in an interlayer insulating film (not shown).

Next, the field effect transistor Q2 is formed in an active region ACT2 having a width in the y direction (gate width direction) greater than that of the active region ACT1 of the field effect transistor Q1. Also, the field effect transistor Q2 includes a gate electrode GE2 extending in the y direction across the active region ACT2. Further, the field effect transistor Q1 includes an epitaxial layer EPI2 formed on the active region ACT2 sandwiching the gate electrode GE2, and the epitaxial layer EPI2 is electrically connected to a plug PLG2 formed in an interlayer insulating film (not shown).

As described above, the semiconductor device according to the first embodiment includes a plurality of active regions (ACT1 and ACT2) each having different widths in the gate width direction (y direction). At this time, in FIG. 14, for example, the width of the active region ACT1 in the y direction in which the field effect transistor Q1 is formed is smaller than 250 nm, and the width of the active region ACT2 in the y direction in which the field effect transistor Q2 is formed is greater than 250 nm. In this case, since the epitaxial layer EPI1 is formed on the active region ACT1 and the epitaxial layer EPI2 is formed on the active region ACT2, the relation of the width in the gate width direction (y direction) between the active region ACT1 and the active region ACT2 can also be expressed as the relation of the width in the gate width direction (y direction) between the epitaxial layer EPI1 and the epitaxial layer EPI2. Namely, in the semiconductor device according to the first embodiment, the width of the epitaxial layer EPI1 in the gate width direction (y direction) is greater than the width of the epitaxial layer EPI2 in the gate width direction (y direction). In the manner described above, the semiconductor device is configured to have the planar configuration including the field effect transistor Q1 and the field effect transistor Q2.

<<Cross-Sectional Configuration (Gate Length Direction)>>

Subsequently, the cross-sectional configuration of the semiconductor device according to the first embodiment will be described. In particular, although the semiconductor device according to the first embodiment includes the field effect transistor Q1 and the field effect transistor Q2 as shown in FIG. 14, since the cross-sectional configuration of the field effect transistor Q1 in a gate length direction is basically the same as the cross-sectional configuration of the field effect transistor Q2 in the gate length direction, the field effect transistor Q1 will be described as a representative here.

Figure 15:
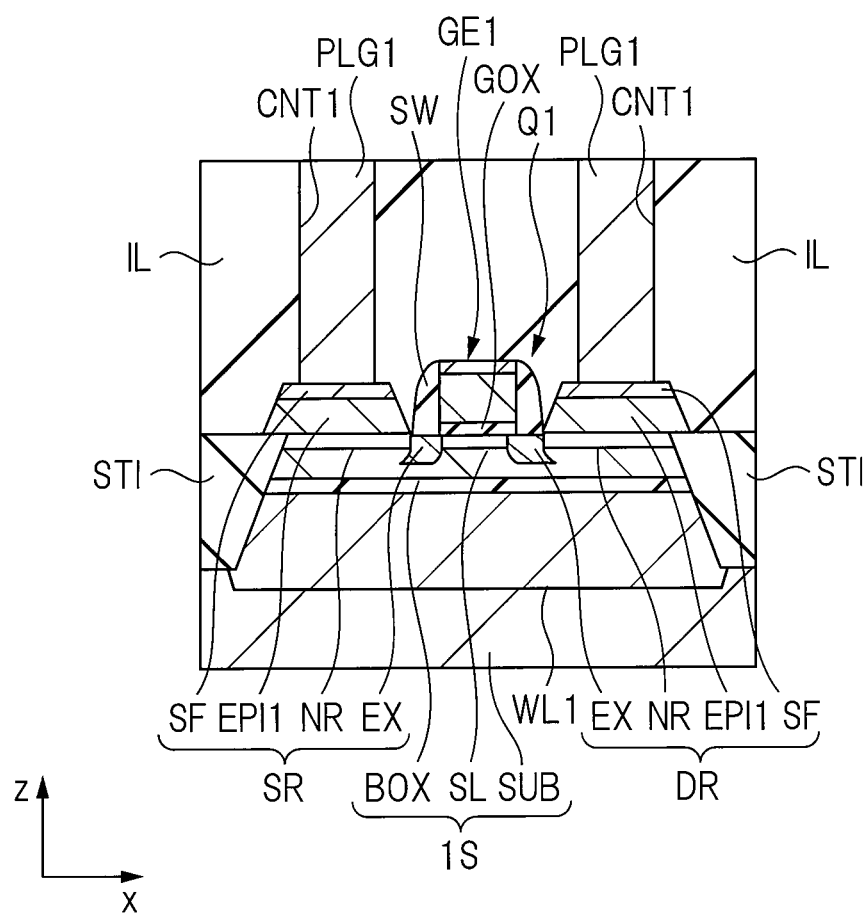
FIG. 15 is a cross-sectional view taken along a line A-A of FIG. 14.

FIG. 15 is a cross-sectional view taken along a line A-A of FIG. 14, and is a cross-sectional view schematically showing a cross-sectional configuration of the field effect transistor Q1 in the gate length direction included in the first embodiment. As shown in FIG. 15, the field effect transistor Q1 according to the first embodiment is formed on the SOI substrate 1S comprised of the support substrate SUB, the buried insulating layer BOX formed on the support substrate SUB, and the semiconductor layer SL formed on the buried insulating layer BOX, and further including the element isolation portion STI and the well WL1. Specifically, the field effect transistor Q1 includes a gate insulating film GOX formed on the semiconductor layer SL in the active region surrounded by the element isolation portion STI and the gate electrode GE1 formed on the gate insulating film GOX. In addition, a sidewall spacer SW is formed on each side wall of the gate electrode GE1. Further, extension regions EX are formed in the semiconductor layer SL in the active region so as to be aligned with the gate electrode GE1, and a semiconductor region NR is formed outside each of the extension regions EX so as to be aligned with the sidewall spacer SW. Also, the epitaxial layer EPI1 is formed on the semiconductor region NR formed in the semiconductor layer SL, and a silicide film SF is formed on the surface of the epitaxial layer EPI1. In this manner, in the field effect transistor Q1, for example, a source region SR made up of the extension region EX, the semiconductor region NR, the epitaxial layer EPI1, and the silicide film SF is formed. Similarly, in the field effect transistor Q1, for example, a drain region DR made up of the extension region EX, the semiconductor region NR, the epitaxial layer EPI1, and the silicide film SF is formed.

Subsequently, the interlayer insulating film IL is formed so as to cover the field effect transistor Q1 configured as described above, and the plug PLG1 penetrating through the interlayer insulating film IL to reach the source region SR is formed in the interlayer insulating film IL. Similarly, the plug PLG1 penetrating through the interlayer insulating film IL to reach the drain region DR is also formed in the interlayer insulating film IL. In particular, the plug PLG1 is formed by burying a conductive material (tungsten) in the contact hole CNT1 that penetrates through the interlayer insulating film IL to expose the silicide film SF formed on the surface of the epitaxial layer EPI1. The field effect transistor Q1 according to the first embodiment is configured in the manner described above.

In particular, the first embodiment assumes that a fully depleted transistor is adopted as the field effect transistor Q1 formed on the SOI substrate 1S. The fully depleted transistor is excellent from the viewpoint of suppressing the short channel effect, and can sufficiently suppress the variation in threshold voltage due to the variation in impurity because no impurity is introduced into the channel region (semiconductor layer SL just below the gate electrode GE1). Accordingly, it is possible to provide the semiconductor device with excellent performance by adopting the fully depleted transistor. At this time, since it is necessary to fully deplete the semiconductor layer (silicon layer) SL in the fully depleted transistor, it is necessary to make the semiconductor layer SL of the SOI substrate 1S very thin. Also, when the configuration in which the threshold voltage of the field effect transistor Q1 formed on the semiconductor layer SL of the SOI substrate 1S is adjusted not only by the gate potential applied to the gate electrode GE1 but also by the back-gate potential applied to the well WL1 of the SOI substrate 1S is adopted, it is necessary to make the buried insulating layer BOX thin.

From the foregoing, for example, in the first embodiment, the thickness of the semiconductor layer SL is set to 5 nm or greater and 20 nm or smaller, and the thickness of the buried insulating layer BOX is also set to 5 nm or greater and 20 nm or smaller. Thus, according to the first embodiment, the field effect transistor Q1 composed of a fully depleted transistor can be realized, and the threshold voltage of the field effect transistor Q1 can be easily adjusted also by the back-gate potential to be applied to the well WL1.

However, when the thickness of the semiconductor layer SL is reduced, the resistance of each of the source region SR and the drain region DR of the field effect transistor Q1 is increased. Thus, in the first embodiment, the epitaxial layer EPI1 is formed on the semiconductor layer SL as shown in FIG. 15. Therefore, in the field effect transistor Q1 according to the first embodiment, the fully depleted transistor is realized by reducing the thickness of the semiconductor layer SL, while the resistance value of each of the source region SR and the drain region DR can be reduced by forming the epitaxial layer EPI1 functioning as a stacked layer on each of the source region SR and the drain region DR. As a result, according to the first embodiment, it is possible to provide the field effect transistor Q1 with excellent performance.

<<Cross-Sectional Configuration (Gate Width Direction)>>

Figure 16:
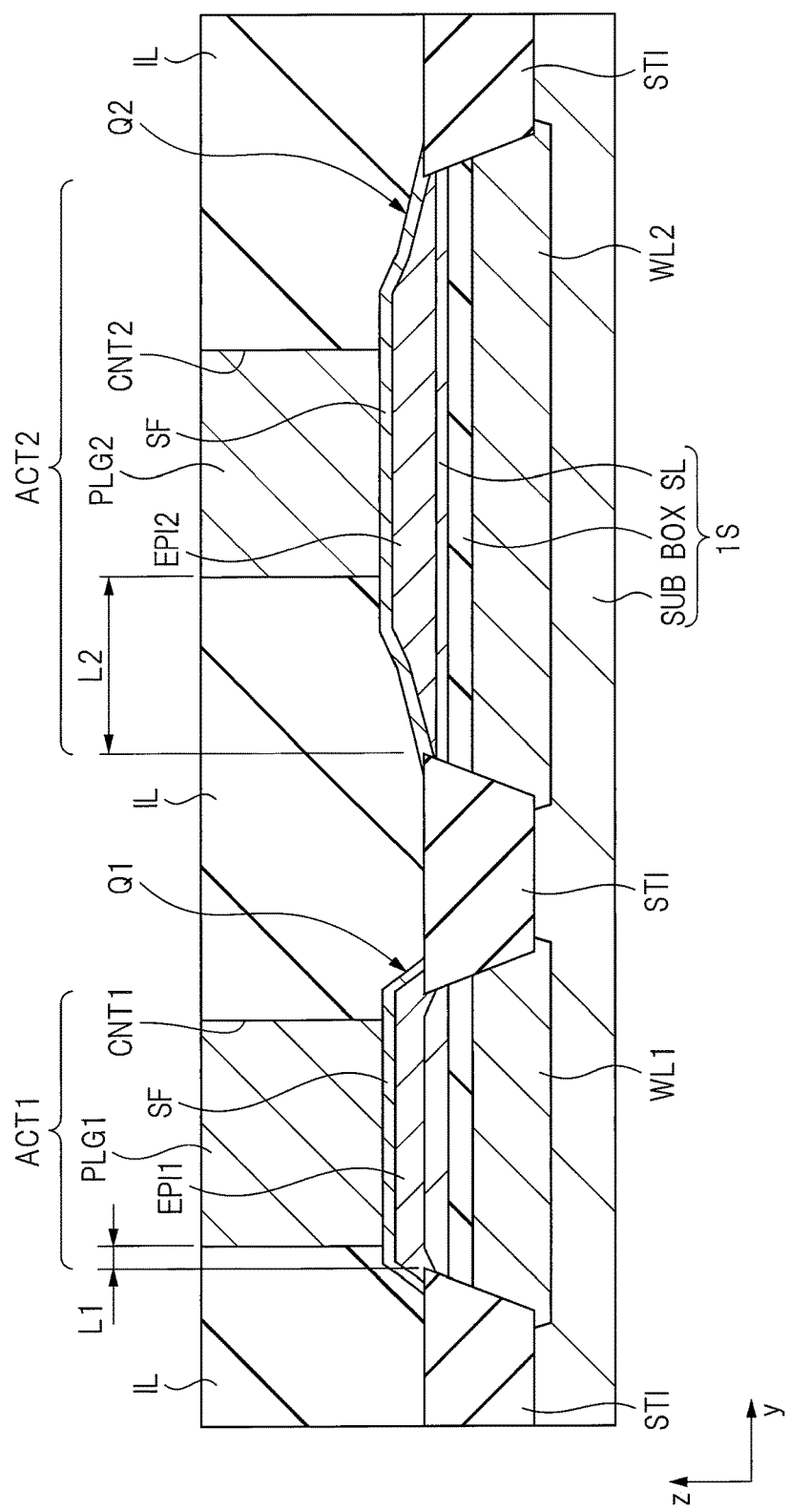
FIG. 16 is a cross-sectional view taken along a line B-B of FIG. 14.

Next, the cross-sectional configuration of the semiconductor device according to the first embodiment in the gate width direction (y direction) will be described. FIG. 16 is a cross-sectional view taken along a line B-B of FIG. 14. In FIG. 16, the cross-sectional configuration of the field effect transistor Q1 in the gate width direction is shown on the left side of FIG. 16, and the cross-sectional configuration of the field effect transistor Q2 in the gate width direction is shown on the right side of FIG. 16. Namely, in FIG. 16, the cross-sectional configuration of the field effect transistor Q1 in the gate width direction and the cross-sectional configuration of the field effect transistor Q2 in the gate width direction are arranged adjacent to each other.

In the cross-sectional configuration of the field effect transistor Q1 in the gate width direction shown on the left side of FIG. 16, the element isolation portion STI and the well WL1 are formed in the SOI substrate 1S. Also, the epitaxial layer EPI1 is formed over the semiconductor layer of the SOI substrate 1S and a part of the element isolation portion STI, and the silicide layer SF is formed on the surface of the epitaxial layer EPI1. Further, the interlayer insulating film IL is formed so as to cover the epitaxial layer EPI1 having the silicide film SF formed on the surface thereof, and the plug PLG1 penetrating through the interlayer insulating film IL to reach the epitaxial layer EPI1 having the silicide film SF formed thereon is formed. The plug PLG1 is formed by burying a conductive material in the contact hole CNT1 formed in the interlayer insulating film IL.

In particular, the field effect transistor Q1 according to the first embodiment assumes that the width of the semiconductor layer SL in the gate width direction (width of the active region ACT1 in the y direction in FIG. 14) is smaller than 250 nm. In this case, the "facet structure" is formed at the end portion of the epitaxial layer EPI1 as shown on the left side of FIG. 16.

Subsequently, in the cross-sectional configuration of the field effect transistor Q2 in the gate width direction shown on the right side of FIG. 16, the element isolation portion STI and the well WL2 are formed in the SOI substrate 1S. Also, the epitaxial layer EPI2 is formed over the semiconductor layer of the SOI substrate 1S and a part of the element isolation portion STI, and the silicide layer SF is formed on the surface of the epitaxial layer EPI2. Further, the interlayer insulating film IL is formed so as to cover the epitaxial layer EPI2 having the silicide film SF formed on the surface thereof, and the plug PLG2 penetrating through the interlayer insulating film IL to reach the epitaxial layer EPI2 having the silicide film SF formed thereon is formed. The plug PLG2 is formed by burying a conductive material in the contact hole CNT2 formed in the interlayer insulating film IL.

In particular, the field effect transistor Q2 according to the first embodiment assumes that the width of the semiconductor layer SL in the gate width direction (width of the active region ACT2 in the y direction in FIG. 14) is greater than 250 nm. In this case, the "flared structure" is formed at the end portion of the epitaxial layer EPI2 as shown on the right side of FIG. 16.

Here, as shown in FIG. 16, the thickness of the end portion of the epitaxial layer EPI1, which is in contact with the element isolation portion STI, is greater than the thickness of the end portion of the epitaxial layer EPI2, which is in contact with the element isolation portion STI. In other words, the thickness of the end portion of the epitaxial layer EPI2, which is in contact with the element isolation portion STI, is smaller than the thickness of the end portion of the epitaxial layer EPI1, which is in contact with the element isolation portion STI. This is because the "facet structure" is formed at the end portion of the epitaxial layer EPI1, while the "flared structure" is formed at the end portion of the epitaxial layer EPI2. Namely, when the width of the semiconductor layer SL in the gate width direction (width of the active region ACT2 in they direction in FIG. 14) is greater than 250 nm, the "flared structure" becomes apparent, with the result that the thickness of the end portion of the epitaxial layer EPI2, which is in contact with the element isolation portion STI, becomes smaller than the thickness of the end portion of the epitaxial layer EPI1, which is in contact with the element isolation portion STI.

Subsequently, as shown in FIG. 16, in the first embodiment, a shortest distance L2 between the element isolation portion STI and the plug PLG2 in the y direction is greater than a shortest distance L1 between the element isolation portion STI and the plug PLG1 in the y direction. In other words, the shortest distance L1 between the element isolation portion STI and the plug PLG1 in the y direction is smaller than the shortest distance L2 between the element isolation portion STI and the plug PLG2 in the y direction. At this time, the shortest distance L2 is, for example, 60 nm or greater. However, the shortest distance L2 may be 90 nm or greater in some cases. In particular, in the first embodiment, the epitaxial layer EPI2 is present between the plug PLG2 and the element isolation portion STI in a plan view. In the manner described above, the field effect transistor Q1 and the field effect transistor Q2 according to the first embodiment are configured.

Note that the case where one plug PLG2 is formed in the wide active region ACT2 has been described as an example in the first embodiment, but the number of plugs PLG2 is not limited to this. For example, when the width of the active region ACT2 is 0.50 μm or greater as shown in FIG. 8B described above, it is possible to form a plurality of the plugs PLG2. Also in such a case, the shortest distance L2 between the element isolation portion STI and the plug PLG2 closest to the element isolation portion STI is set to 60 nm or greater.

<Method of Manufacturing Semiconductor Device>

The semiconductor device according to the first embodiment is configured as described above, and the method of manufacturing thereof will be described below with reference to drawings.

Figure 17:
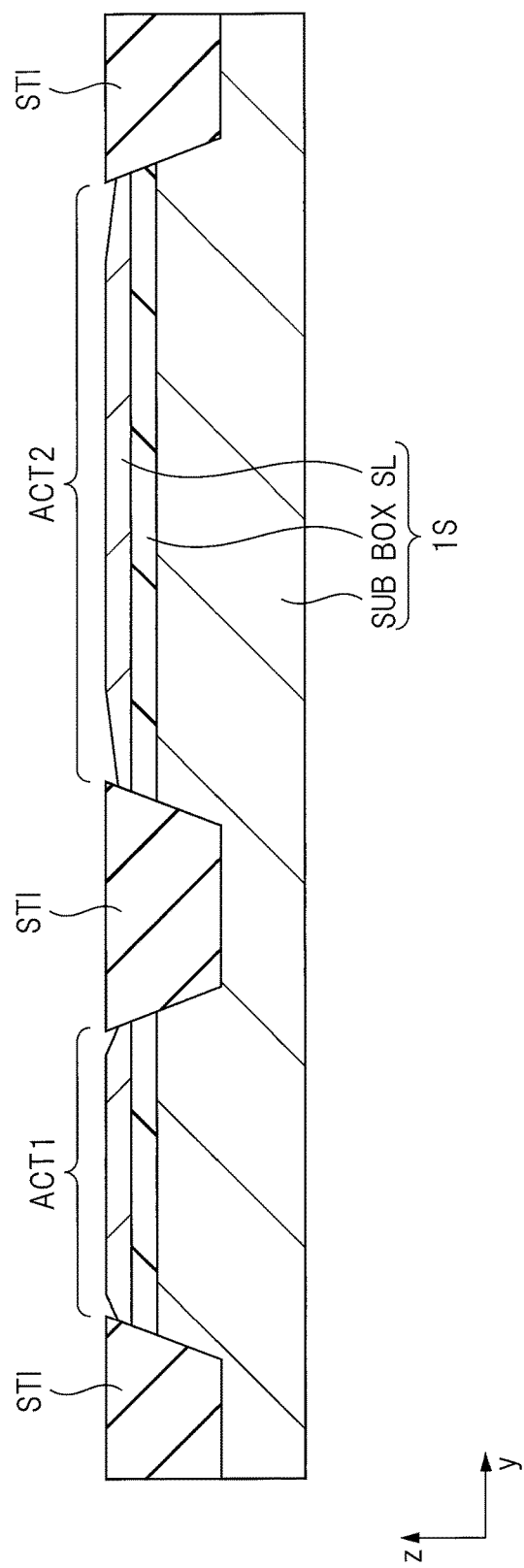
FIG. 17 is a cross-sectional view showing a manufacturing process of the semiconductor device according to the first embodiment.

First, as shown in FIG. 17, in the method of manufacturing the semiconductor device according to the first embodiment, the SOI substrate 1S comprised of the support substrate SUB, the buried insulating layer BOX formed on the support substrate SUB, and the semiconductor layer SL formed on the buried insulating layer BOX is prepared.

Next, by forming the element isolation portion STI in the SOI substrate 1S, the active region ACT1 having a first width in the y direction and the active region ACT2 isolated from the active region ACT1 by the element isolation portion STI and having a width in the y direction greater than the first width are formed in the SOI substrate 1S. At this time, as shown in FIG. 17, the (100) plane is exposed in the most part including the center part of the surface of the semiconductor layer SL. Meanwhile, as shown in FIG. 17, the end portion of the surface of the semiconductor layer SL is inclined, and the high-index plane different from the (100) plane is exposed as the inclined surface.

Figure 18:
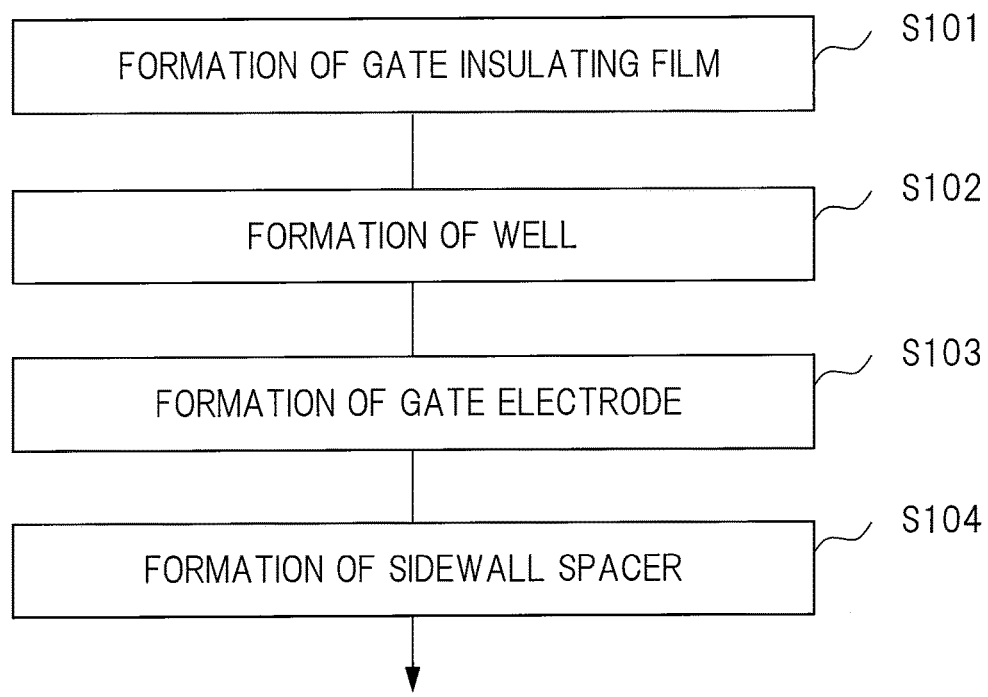
FIG. 18 is a flowchart showing the manufacturing process of the semiconductor device continued from FIG. 17.

Subsequently, the gate insulating film is formed on the semiconductor layer SL of the SOI substrate 1S (S101 of FIG. 18). Thereafter, the well is formed by introducing a conductivity-type impurity into the support substrate SUB of the SOI substrate 1S by the ion implantation method or the like (S102 of FIG. 18). Then, after a polysilicon film is formed on the gate insulating film, the gate electrode is formed by patterning the polysilicon film by using the photolithography technique and the etching technique (S103 of FIG. 18). Next, after an insulating film is formed so as to cover the gate electrode, the anisotropic etching is performed to the insulating film, thereby forming the sidewall spacers on both side surfaces of the gate electrode (S104 of FIG. 18).

As described above, when the element isolation portion STI is recessed down from the surface of the semiconductor layer SL in the process so far, the side surface of the semiconductor layer SL is exposed, and thus the end portion of the semiconductor layer SL is likely to have a rounded or inclined shape in comparison to the center part.

Figure 19:
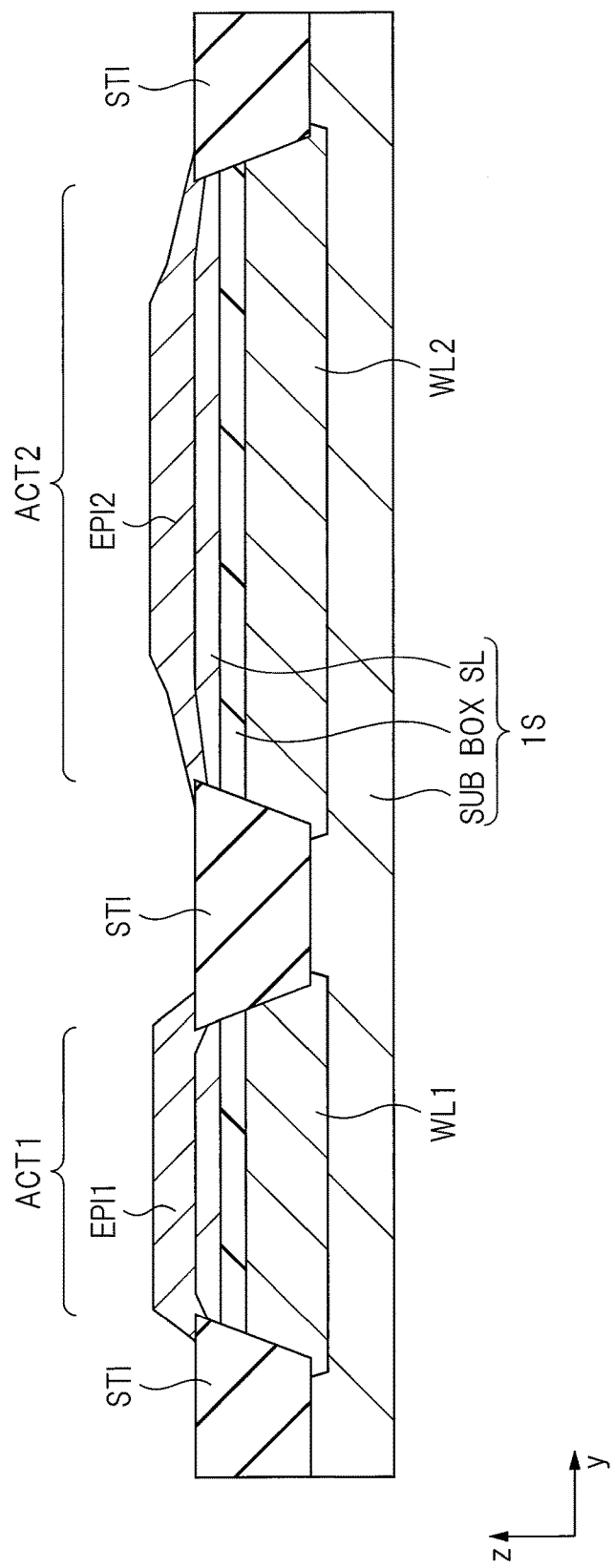
FIG. 19 is a cross-sectional view showing the manufacturing process of the semiconductor device continued from FIG. 18.

Next, as shown in FIG. 19, the epitaxial layer EPI1 is formed on the semiconductor layer SL in the active region ACT1 and the epitaxial layer EPI2 is formed on the semiconductor layer SL in the active region ACT2 by using the epitaxial growth method. At this time, in the first embodiment, the "facet structure" is formed at the end portion of the epitaxial layer EPI1, while the "flared structure" is formed at the end portion of the epitaxial layer EPI2. As a result, as shown in FIG. 19, the thickness of the end portion of the epitaxial layer EPI2, which is in contact with the element isolation portion STI, is smaller than the thickness of the end portion of the epitaxial layer EPI1, which is in contact with the element isolation portion STI. Note that the thickness of the epitaxial layer EPI1 and the thickness of the epitaxial layer EPI2 can be, for example, 10 nm or greater and 50 nm or smaller.

In this epitaxial growth method, gas containing $SiH_2Cl_2$, HCl, and $H_2$ is used, and the film forming conditions that the pressure is 10 Pa or higher and 1000 Pa or lower and the temperature is 700° C. or higher and 800° C. or lower are used. However, other than those, in this epitaxial growth method, gas containing $SiH_4$, HCl, and $H_2$ may be used, and the film forming conditions that the pressure is 10 Pa or higher and 1000 Pa or lower and the temperature is 500° C. or higher and 700° C. or lower may be used. At this time, $SiH_2Cl_2$ and $SiH_4$ are used as material gas of silicon (Si). On the other hand, HCl is used to ensure the selectivity in the epitaxial growth method, and $H_2$ is used to prevent the gas atmosphere from containing water and oxygen as much as possible. For the stabilization of the epitaxial growth, the hydrogen annealing at about 700° C. to 900° C. may be performed, while maintaining the vacuum state, just before the epitaxial growth to form the epitaxial layer EPI1 and the epitaxial layer EPI2.

Further, in the epitaxial growth method mentioned here, a film forming apparatus (vertical furnace) in which a plurality of the SOI substrates 1S can be simultaneously processed and an inner wall of which is coated with silicon is used.

Figure 20:
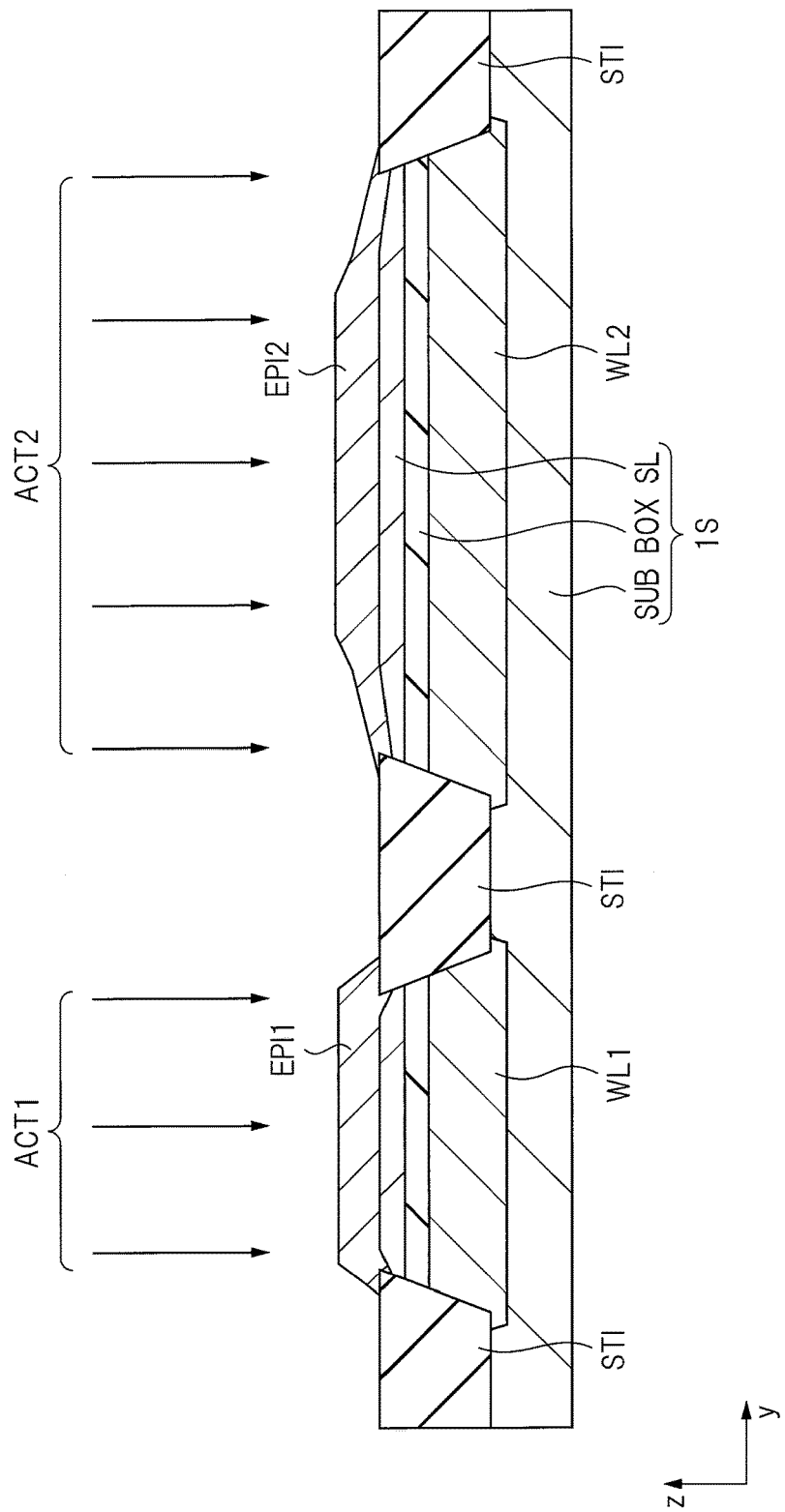
FIG. 20 is a cross-sectional view showing the manufacturing process of the semiconductor device continued from FIG. 19.

Subsequently, as shown in FIG. 20, a conductivity-type impurity is introduced into the semiconductor layer SL and the epitaxial layer EPI1 formed in the active region ACT1 and a conductivity-type impurity is introduced into the semiconductor layer SL and the epitaxial layer EPI2 formed in the active region ACT2 by using the photolithography technique and the ion implantation method.

Figure 21:
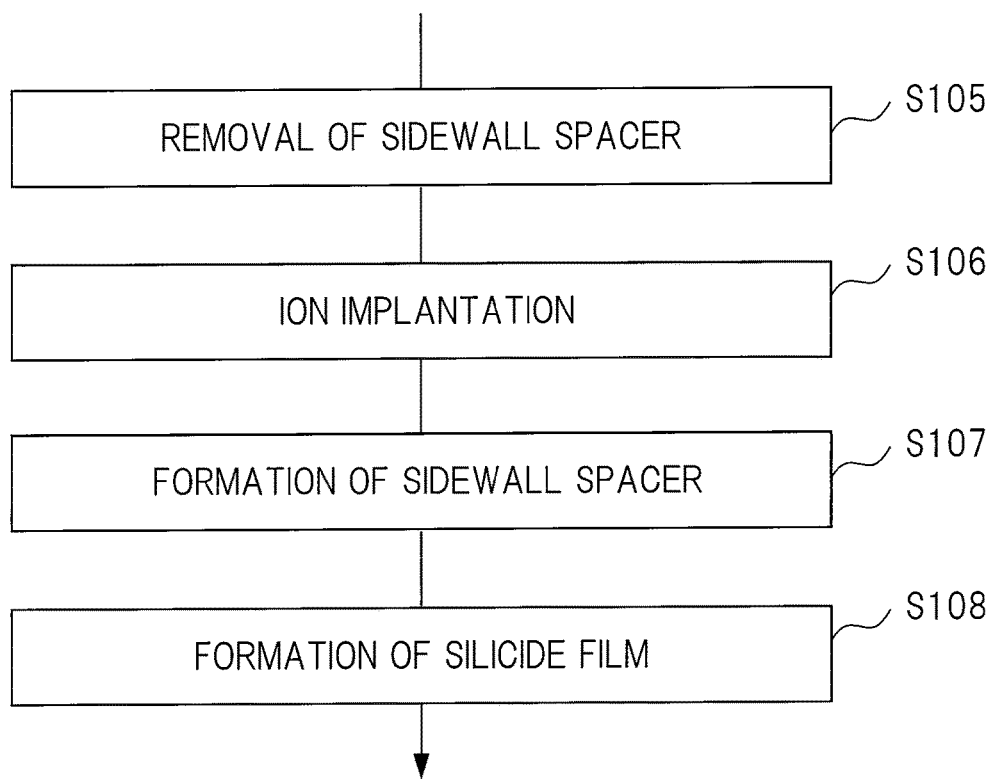
FIG. 21 is a flowchart showing the manufacturing process of the semiconductor device continued from FIG. 20.

Next, after the sidewall spacer is removed (S105 of FIG. 21), the extension regions are formed by using the photolithography technique and the ion implantation method (S106 of FIG. 21). Then, the sidewall spacers are formed on both side walls of the gate electrode again (S107 of FIG. 21). Thereafter, the silicide film is formed on the surface of the gate electrode, the surface of the epitaxial layer EPI1, and the surface of the epitaxial layer EPI2 (step S108 of FIG. 21).

Figure 22:
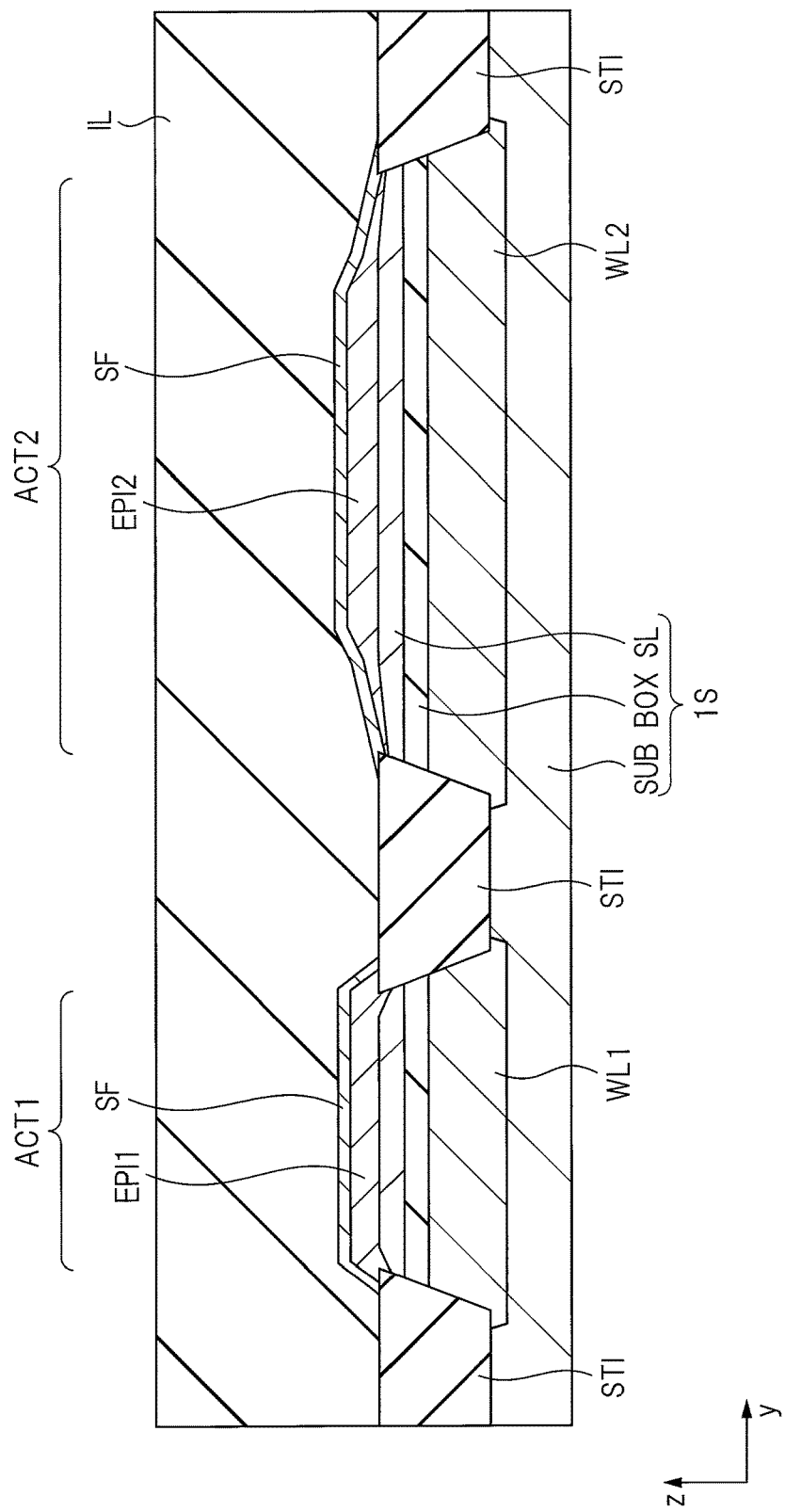
FIG. 22 is a cross-sectional view showing the manufacturing process of the semiconductor device continued from FIG. 21.

Subsequently, as shown in FIG. 22, the interlayer insulating film IL made of, for example, a silicon oxide film is formed so as to cover the epitaxial layer EPI1 and the epitaxial layer EPI2. Thereafter, as shown in FIG. 23, by using the photolithography technique and the etching technique, the contact hole CNT1 reaching the epitaxial layer EPI1 (silicide film SF) is formed in the interlayer insulating film IL, and the contact hole CNT2 reaching the epitaxial layer EPI2 (silicide film SF) is formed in the interlayer insulating film IL.

Figure 23:
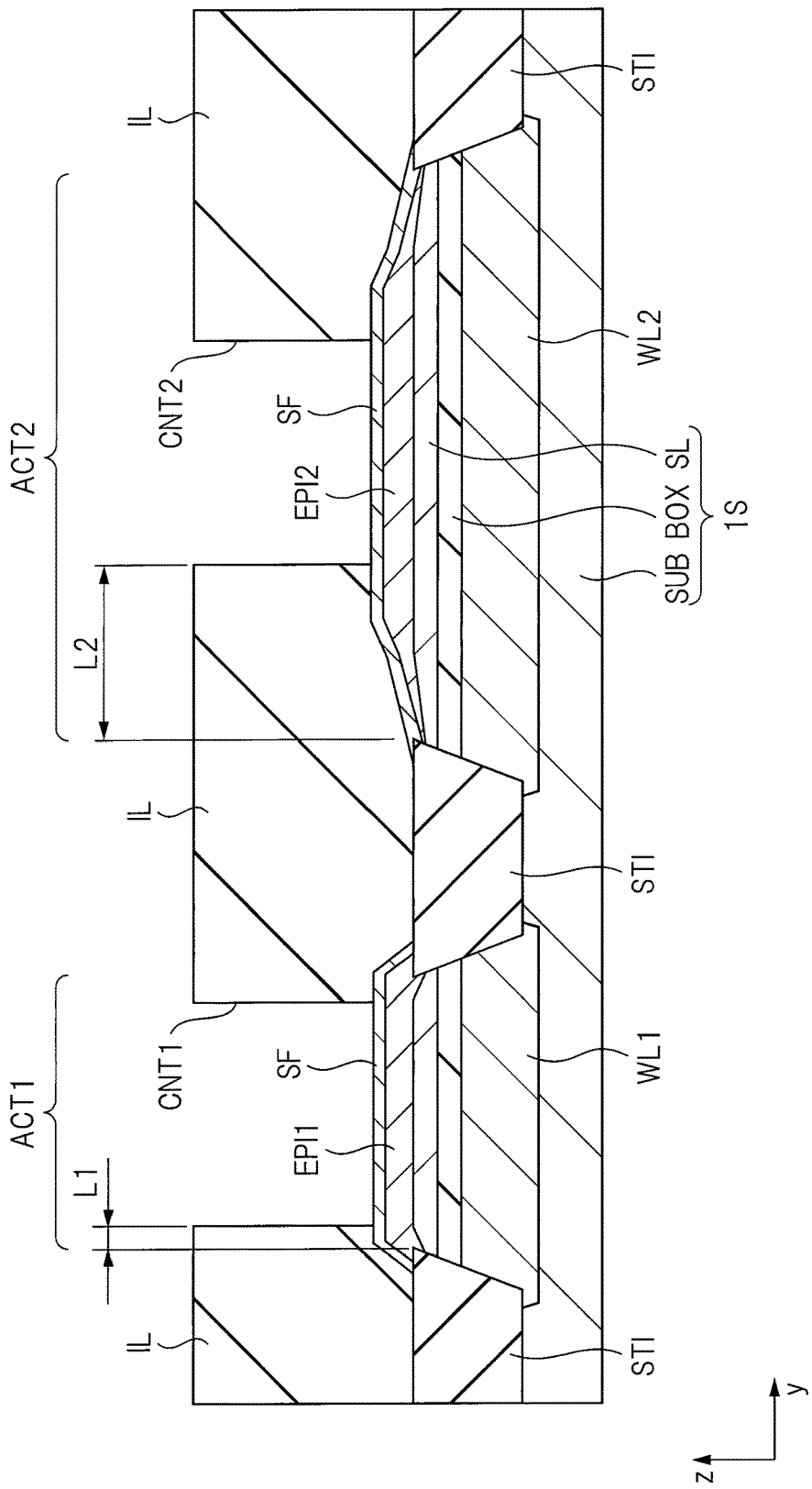
FIG. 23 is a cross-sectional view showing the manufacturing process of the semiconductor device continued from FIG. 22.

At this time, in the process of forming the contact holes (CNT1 and CNT2), as shown in FIG. 23, the contact holes (CNT1 and CNT2) are formed in the interlayer insulating film IL such that the shortest distance L2 between the element isolation portion STI and the contact hole CNT2 in the y direction is greater than the shortest distance L1 between the element isolation portion STI and the contact hole CNT1 in the y direction.

Then, the plug PLG1 made of a conductive material buried in the contact hole CNT1 is formed in the interlayer insulating film IL, and the plug PLG2 made of a conductive material buried in the contact hole CNT2 is formed in the interlayer insulating film IL. Consequently, the shortest distance L2 between the element isolation portion STI and the plug PLG2 in the y direction is greater than the shortest distance L1 between the element isolation portion STI and the plug PLG1 in the y direction.

In the manner described above, the semiconductor device according to the first embodiment can be manufactured.

Characteristics of First Embodiment

Next, characteristic points of the first embodiment will be described. The first characteristic point of the first embodiment is that, in the active region having a width in the gate width direction greater than a predetermined width among a plurality of active regions, a restriction is placed on the formation position of the plug connected to the epitaxial layer formed on the semiconductor layer in the active region. As a result, even when the "flared structure" is formed at the end portion of the epitaxial layer, the penetration of the plug to the support substrate due to the positional deviation of the contact hole can be prevented.

Specifically, the first characteristic point of the first embodiment is to place a restriction that the shortest distance between the element isolation portion and the plug in the gate width direction is made greater than a predetermined distance. As a result, it is possible to prevent the penetration of the plug to the support substrate. Hereinafter, the reason therefor will be described. First, when the width of the active region in the gate width direction is greater than a predetermined width, the "flared structure" is formed at the end portion of the epitaxial layer formed on the semiconductor layer in the active region. Then, when the plug is formed so as to be connected to the "flared structure" formed at the end portion of the epitaxial layer, the thickness of the epitaxial layer is small in the "flared structure". Accordingly, the part of the epitaxial layer in which the "flared structure" is formed does not sufficiently function as an etching stopper for the etching to form the contact hole. Therefore, if the contact hole is formed so as to be connected to the "flared structure" formed at the end portion of the epitaxial layer, the contact hole reaches the support substrate, so that the penetration of the plug to the support substrate occurs. For this reason, in the first embodiment, a restriction is placed on the formation position of the plug such that the shortest distance between the element isolation portion and the plug in the gate width direction becomes greater than the predetermined distance. In other words, the first characteristic point of the first embodiment is an idea to prohibit the plug from being formed at the position at which the shortest distance between the element isolation portion and the plug in the gate width direction becomes smaller than the predetermine distance. Namely, the first characteristic point of the first embodiment is based on the basic idea that, if the plug is formed at the position away from the element isolation portion by a predetermined distance in consideration of the fact that the "flared structure" is formed in the region within the predetermined distance from the element isolation portion, it is possible to prevent the plug from being formed at the part of the epitaxial layer having a small thickness. As a result, according to the first characteristic point of the first embodiment, it is possible to effectively prevent the penetration of the plug to the support substrate.

Further, it is also possible to obtain a secondary effect that the first characteristic point of the first embodiment can be effectively used for the screening of good products of the semiconductor devices. Namely, by placing a restriction on the formation position of the plug, the semiconductor device in which the plug is formed at the position allowed by the restriction can be shipped as a good product in which no penetration of the plug to the support substrate occurs. Meanwhile, for example, there is a case where the designed position is the position allowed by the restriction, but the formation position of the plug deviates from the allowed position and the plug is formed at the prohibited position depending on the accuracy of the photolithography in the actual manufacturing process. In this case, it is possible to determine that the plug is formed at the position prohibited by the restriction by measuring the shortest distance between the element isolation portion and the plug in the actually manufactured semiconductor device. Consequently, by the inspection based on the first characteristic point of the first embodiment, the semiconductor device, in which the designed position is the position allowed by the restriction, but the formation position of the plug deviates from the allowed position and the plug is formed at the prohibited position depending on the accuracy of the photolithography in the actual manufacturing process, can be prevented from being shipped beforehand.

As described above, by using the first characteristic point of the first embodiment as a design standard for preventing the penetration of the plug to the support substrate, it is possible to improve the reliability of the semiconductor device including the field effect transistor formed in the active region having a width in a gate width direction greater than a predetermined width. Further, the first characteristic point of the first embodiment can be used also as the standard of the inspection process, and thus the distribution of defective products to the market can be suppressed. From the foregoing, by using the first characteristic point of the first embodiment as the design idea in the semiconductor device in which the field effect transistor is formed in the active region having a width in a gate width direction greater than a predetermined width, the penetration of the plug to the support substrate can be effectively prevented. Also, by using the first characteristic point of the first embodiment as the inspection standard in the inspection process as to whether the semiconductor device actually manufactured satisfies the design idea, the distribution of defective products to the market can be prevented. Namely, the first characteristic point of the first embodiment can contribute to the improvement in reliability of the semiconductor device not only by the factor (first factor) resulting from the capability of being able to prevent the penetration of the plug to the support substrate, but also by the factor (second factor) that the shipment of defective products can be prevented beforehand. Consequently, the first characteristic point of the first embodiment is a useful technical idea in the point that the reliability of the semiconductor device can be improved by the synergy effect of the first factor and the second factor described above.

<<Specific Expression 1 of First Characteristic Point>>

Subsequently, a specific expression showing the first characteristic point of the first embodiment will be described. First, the first embodiment is based on the premise that the epitaxial layer is formed on the semiconductor layer in the active region having a width in a gate width direction greater than a predetermined width. Namely, the "flared structure" is formed at the end portion of the epitaxial layer formed on the semiconductor layer in the active region having a width in a gate width direction greater than a predetermined width. On the other hand, the "facet structure" is formed instead of the "flared structure" at the end portion of the epitaxial layer formed on the semiconductor layer in the active region having a width in a gate width direction smaller than the predetermined width. Then, in the case of the "facet structure", the penetration of the plug to the support substrate can be prevented by adopting the structure shown in FIG. 5 even if the formation position of the contact hole deviates toward the side of the element isolation portion. Namely, unlike the case of the "flared structure", it is not necessary in the case of the "facet structure" to provide the restriction that the shortest distance between the element isolation portion and the plug in the gate width direction is made greater than the predetermined distance. As a result, for the plug connected to the epitaxial layer formed on the semiconductor layer in the active region having a width in a gate width direction smaller than the predetermined width, the shortest distance between the element isolation portion and the plug in the gate width direction may be smaller than the predetermined distance. Therefore, on the premise that there are a plurality of active regions each having different widths in the gate width direction, it is considered that the first characteristic point of the first embodiment can be expressed by the combination of constituent elements A to C shown below (see FIG. 16).

Constituent element A: "the width of the active region ACT2 in the gate width direction (y direction) is greater than the width of the active region ACTT in the gate width direction (y direction)"

Constituent element B: "the thickness of the end portion of the epitaxial layer EPI2, which is in contact with the element isolation portion STI, is smaller than the thickness of the end portion of the epitaxial layer EPI1, which is in contact with the element isolation portion STI"

Constituent element C: "the shortest distance L2 between the element isolation portion STI and the plug PLG2 in the gate width direction (y direction) is greater than the shortest distance L1 between the element isolation portion STI and the plug PLG1 in the gate width direction (y direction)"

<<Specific Expression 2 of First Characteristic Point>>

Further, another specific expression showing the first characteristic point of the first embodiment will be described. Here, the expression of the first characteristic point of the first embodiment is considered by focusing only on the active region having a width in a gate width direction greater than a predetermined width, without the premise that there are a plurality of active regions each having different widths in the gate width direction. Namely, it can be said that the end portion shape changes from the "facet structure" to the "flared structure" with the width of the active region of about 0.25 μm as the boundary as shown in FIG. 8A. Therefore, in the case where the width of the active region is 0.25 μm or smaller (in the case where the "facet structure" is formed), the penetration of the contact hole CNT through the semiconductor layer SL and the buried insulating layer BOX can be suppressed by adopting the structure shown in FIG. 5 even if the formation position of the contact hole CNT deviates toward the side of the element isolation portion STI. Accordingly, the electrical conduction between the semiconductor layer SL and the support substrate SUB through the plug PLG can be prevented. On the other hand, in the case where the width of the active region is 0.25 μm or greater (in the case where the "flared structure" is formed), it is difficult to effectively prevent the penetration of the contact hole CNT through the semiconductor layer SL and the buried insulating layer BOX when the formation position of the contact hole CNT deviates toward the side of the element isolation portion STI even if the structure shown in FIG. 5 is adopted. As a result, there is a possibility that the semiconductor layer SL and the support substrate SUB are electrically conducted through the plug PLG. For this reason, when the width of the active region is 0.25 μm or greater, it is necessary to adopt the first characteristic point of the first embodiment instead of the structure shown in FIG. 5 from the viewpoint of preventing the penetration of the contact hole CNT through the semiconductor layer SL and the buried insulating layer BOX.

Next, as shown in FIG. 8B, in the case where the width of the active region is smaller than 0.25 μm, the "circle mark", the "square mark", the "diamond mark", and the "triangle mark" are almost overlapped with each other, and this means that the thickness at the center of the SOI layer is almost equal to the thickness of the SOI layer at each position only 30 to 90 nm away from the boundary between the epitaxial layer EPI and the element isolation portion STI. Meanwhile, as the width of the active region becomes greater from 0.25 μm, the "circle mark", the "square mark", the "diamond mark", and the "triangle mark" are separated from each other. This means that the thickness of the SOI layer becomes smaller as it approaches from the center position of the epitaxial layer to the boundary position between the epitaxial layer EPI and the element isolation portion STI (90 nm or smaller, in particular, 60 nm or smaller). In other words, this means that the "flared structure" becomes apparent when the width of the active region becomes greater than 0.25 μm. Accordingly, when focusing only on the active region having a width in a gate width direction greater than a predetermined width, it is considered that the first characteristic point of the first embodiment can be expressed by the combination of constituent elements D and E shown below (see FIG. 8 and FIG. 16).

Constituent element D: "the width of the active region ACT2 in the gate width direction is greater than 250 nm"

Constituent element E: "the shortest distance between the element isolation portion STI and the plug PLG2 in the gate width direction (y direction) is greater than 60 nm"

Next, the second characteristic point of the first embodiment will be described. The second characteristic point of the first embodiment is that the technical idea of the first embodiment (first characteristic point) is applied to the semiconductor device including the fully depleted transistor. The fully depleted transistor is excellent from the viewpoint of suppressing the short channel effect, and can sufficiently suppress the variation in threshold voltage due to the variation in impurity because no impurity is introduced into the channel region (semiconductor layer just below the gate electrode). Accordingly, it is possible to provide the semiconductor device with excellent performance by adopting the fully depleted transistor. At this time, since it is necessary to fully deplete the semiconductor layer (silicon layer) in the fully depleted transistor, it is necessary to make the semiconductor layer of the SOI substrate very thin. Also, when the configuration in which the threshold voltage of the field effect transistor formed on the semiconductor layer SL of the SOI substrate is adjusted not only by the gate potential applied to the gate electrode but also by the back-gate potential applied to the well of the SOI substrate is adopted, it is necessary to make the buried insulating layer BOX thin.

In this respect, for example, in the first embodiment, the thickness of the semiconductor layer is set to 10 nm or greater and 20 nm or smaller, and the thickness of the buried insulating layer BOX is also set to 10 nm or greater and 20 nm or smaller. As a result, according to the first embodiment, the field effect transistor composed of a fully depleted transistor can be realized, and the threshold voltage of the field effect transistor can be easily adjusted also by the back-gate potential to be applied to the well.

However, since it is necessary to make the semiconductor layer and the buried insulating layer thin in the semiconductor device including the fully depleted transistor in which the threshold voltage is adjusted also by the back-gate potential, the penetration of the plug to the support substrate is likely to be apparent as a problem. Thus, in the second characteristic point of the first embodiment, the technical idea of the first embodiment (first characteristic point) is applied to the semiconductor device including the fully depleted transistor. As a result, according to the second characteristic point of the first embodiment, it is possible to provide the semiconductor device with excellent performance, while achieving the improvement in the reliability of the semiconductor device by preventing the penetration of the plug to the support substrate.

Next, the third characteristic point of the first embodiment will be described. The third characteristic point of the first embodiment is that, on the premise that the epitaxial growth method for forming the epitaxial layer is performed in the film forming apparatus capable of processing a plurality of semiconductor wafers (SOI substrates) at the same time, a surface of quartz constituting an inner wall of the film forming apparatus is coated with silicon. For example, in the epitaxial growth method in the first embodiment for depositing silicon, HCl is supplied in addition to material gas in order to realize the selective epitaxial growth. Therefore, since the inner wall of the film forming apparatus is originally made of quartz (silicon oxide), it is considered that silicon is not grown on the inner wall of the film forming apparatus. However, in the actual film forming apparatus, a considerable amount of silicon is deposited also on the surface of quartz. Incidentally, in the film forming apparatus in which a large number of semiconductor wafers are processed at the same time, it is required that the epitaxial layers to be formed have small variation in thickness. Also, in the epitaxial growth in the film forming apparatus, the thickness of the silicon to be deposited changes depending on the size of the surface area of the silicon to be exposed. Accordingly, in the case where the quartz is exposed on the inner wall of the film forming apparatus, since most of the quartz is exposed at first, the surface area covered with silicon is small, but as the film forming process advances, silicon is gradually deposited also on the surface of the quartz. In this case, since silicon is present also on the inner wall of the film forming apparatus, the surface area covered with the silicon changes. When the surface area covered with the silicon changes as described above, the thickness of the epitaxial layer formed on the semiconductor wafer also changes. This means that the epitaxial layer has variation in thickness. Then, when the epitaxial layer has variation in thickness, it is considered that there is the case where the thickness of the epitaxial layer formed on a specific semiconductor wafer is smaller than the thickness of the epitaxial layer formed on another semiconductor wafer. However, it is considered that when the thickness of the epitaxial layer is reduced, the size (length) of the "flared structure" formed at the end portion of the epitaxial layer becomes large. Consequently, even when the plug is formed at the position allowed by the restriction defined by the first characteristic point of the first embodiment described above, there is a possibility that the penetration of the plug to the support substrate may occur due to the variation in thickness of the epitaxial layer particularly in the epitaxial layer having small thickness.

Therefore, in the third characteristic point of the first embodiment, silicon coating is applied to the surface of the quartz constituting the inner wall of the film forming apparatus before performing the epitaxial growth method for forming the epitaxial layer. In this case, since the inner wall of the film forming apparatus is already coated with silicon, the surface area in which the silicon is exposed does not change even if the epitaxial growth method is performed thereafter. As a result, according to the third characteristic point of the first embodiment, it is possible to suppress the variation in thickness of the epitaxial layer in the film forming apparatus in which a plurality of semiconductor wafers are processed at the same time. This means that the "flared structure" formed at the end portion of the epitaxial layer is formed almost uniformly in the plurality of semiconductor wafers. Accordingly, the penetration of the plug to the support substrate can be prevented in each of the plurality of semiconductor wafers by forming the plug at the position allowed by the restriction defined by the first characteristic point of the first embodiment described above. In other words, it is possible to obtain the remarkable effect that the penetration of the plug to the support substrate can be reliably suppressed in all of the plurality of semiconductor wafers processed in the film forming apparatus by the restriction defined by the first characteristic point of the first embodiment described above.

Second Embodiment

<Basic Idea of Second Embodiment>

Next, a basic idea of the second embodiment will be described. The basic idea of the second embodiment is that in the epitaxial layer formed on the semiconductor layer in the active region having a width in a gate width direction greater than a predetermined width, a part of the epitaxial layer connected to the plug is formed into a comb shape and a width of each portion of the comb-shaped part in the gate width direction is made small. In this case, the end portion of each portion of the comb-shaped part having a small width in the gate width direction has the "facet structure" instead of the "flared structure". Therefore, the part of the epitaxial layer connected to the plug does not have the "flared structure", so that the penetration of the plug to the support substrate can be prevented. Namely, the basic idea of the first embodiment described above is that in consideration of the fact that the "flared structure" is formed at the end portion of the epitaxial layer formed of the semiconductor layer in the active region having a width in a gate width direction greater than a predetermined width, a restriction is placed on the formation position of the plug such that the plug is not formed at the part of the "flared structure". On the other hand, the basic idea of the second embodiment is that the end portion of the epitaxial layer is formed into a comb shape in order to prevent the "flared structure" itself from being formed at the end portion of the epitaxial layer formed on the semiconductor layer in the active region having a width in a gate width direction greater than a predetermined width.

<Specific Configuration>

Figure 24:
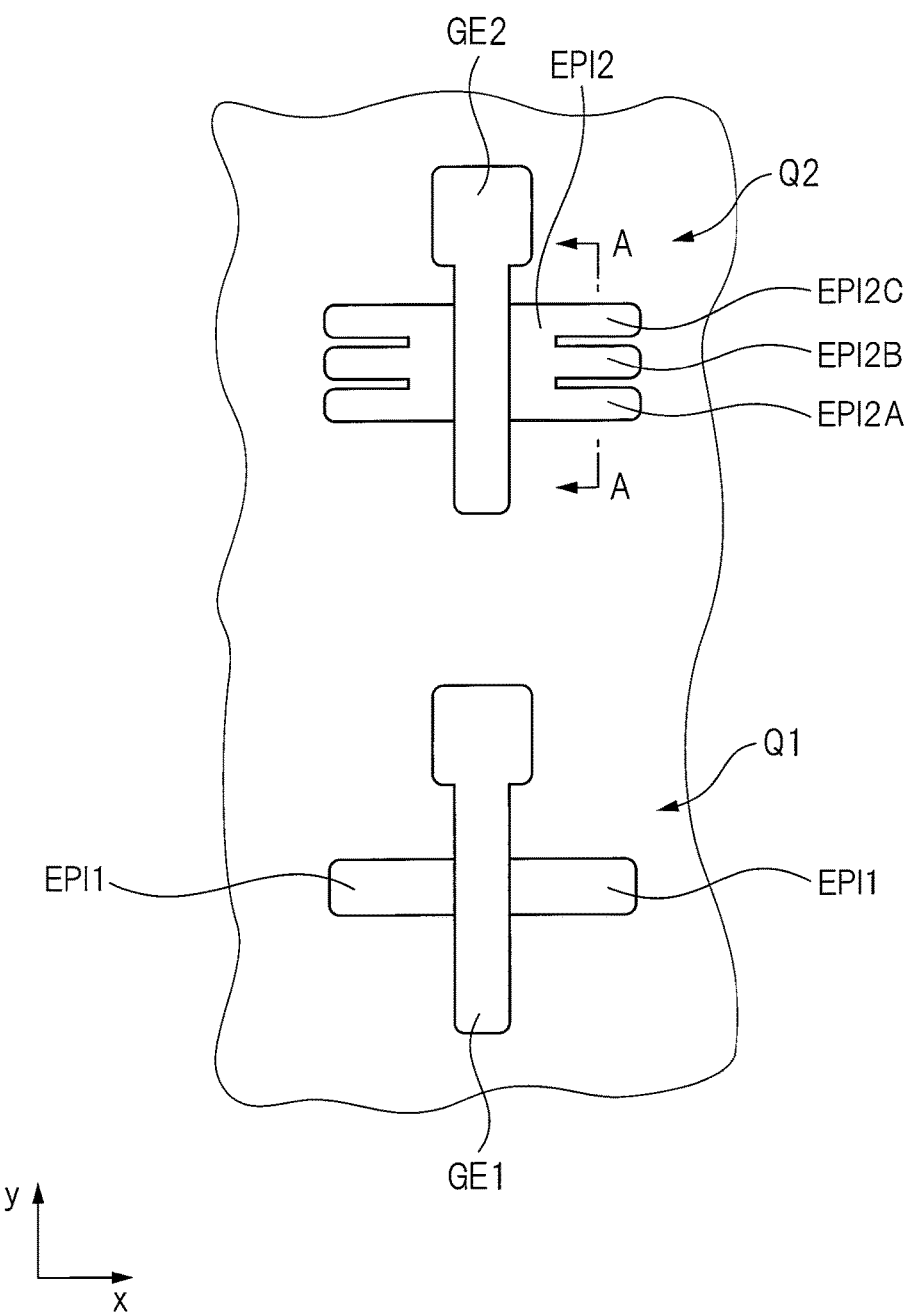
FIG. 24 is a plan view schematically showing a configuration of a semiconductor device according to a second embodiment.

Hereinafter, a specific configuration for embodying the basic idea of the second embodiment will be described. FIG. 24 is a view showing a schematic planar configuration of the semiconductor device according to the second embodiment. As shown in FIG. 24, for example, the semiconductor device according to the second embodiment includes a field effect transistor Q1 formed in an active region having a width in the gate width direction (y direction) smaller than a predetermined width and a field effect transistor Q2 formed in an active region having a width in the gate width direction (y direction) greater than the predetermined width.

In this case, a characteristic point of the second embodiment is based on the premise that there is the field effect transistor Q2 formed in the active region having a width in the gate width direction (y direction) greater than the predetermined width. Also, the characteristic point of the second embodiment is that the epitaxial layer EPI2 formed on the semiconductor layer in the active region includes a wide portion which has a first width in the y direction in a plan view and a plurality of narrow portions which have a second width smaller than the first width in the y direction in a plan view, are formed integrally with the wide portion, and are arranged in the y direction. Further, in the second embodiment, the plug is connected to at least one of the plurality of narrow portions. In other words, it can be said that the characteristic point of the second embodiment lies in that the end portion of the epitaxial layer EPI2 formed on the semiconductor layer in the active region is divided into a plurality of portions (EPI2A, EPI2B, and EPI2C) arranged in parallel and is formed into a comb shape as shown in FIG. 24. Also, in the second embodiment, the plug is connected to at least the comb-shaped portion formed at the end portion of the epitaxial layer EPI2. As a result, according to the second embodiment, the penetration of the plug to the support substrate can be prevented. This point will be described below.

Figure 25:
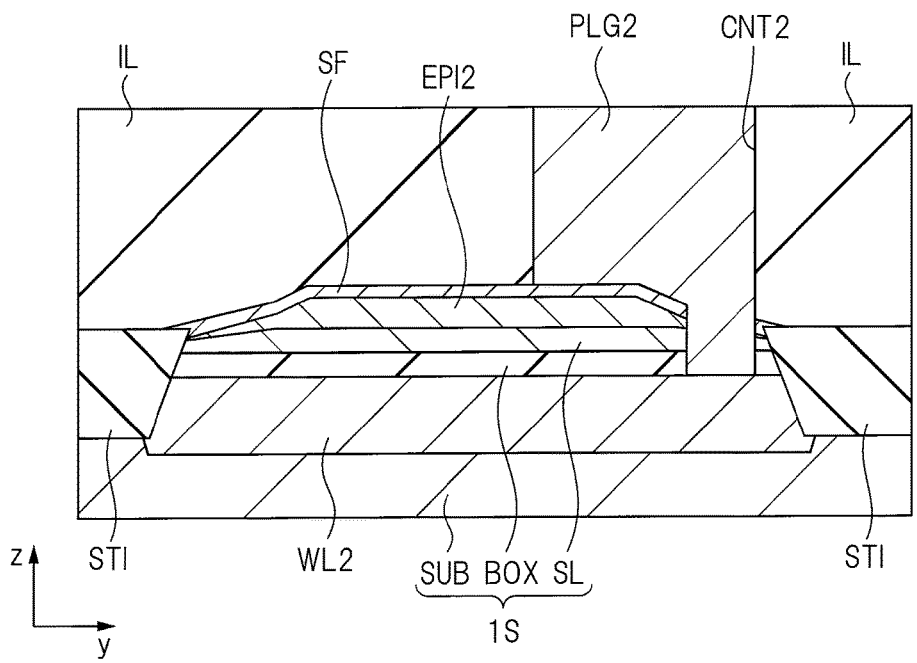
FIG. 25 is a view for describing penetration of a plug to a support substrate.

First, FIG. 25 is a view schematically showing the cross-sectional configuration in the case where the end portion of the epitaxial layer EPI2 formed on the semiconductor layer in the active region does not have a comb shape in the field effect transistor Q2 formed in the active region having a width in a gate width direction (y direction) greater than a predetermined width. In this case, as shown in FIG. 25, it can be seen that the "flared structure" is formed at the end portion of the epitaxial layer EPI2, with the result that the penetration of the plug PLG2 to the support substrate SUB (well WL2) occurs at the end portion of the epitaxial layer EPI2 where the thickness of the epitaxial layer EPI2 is small.

Figure 26:
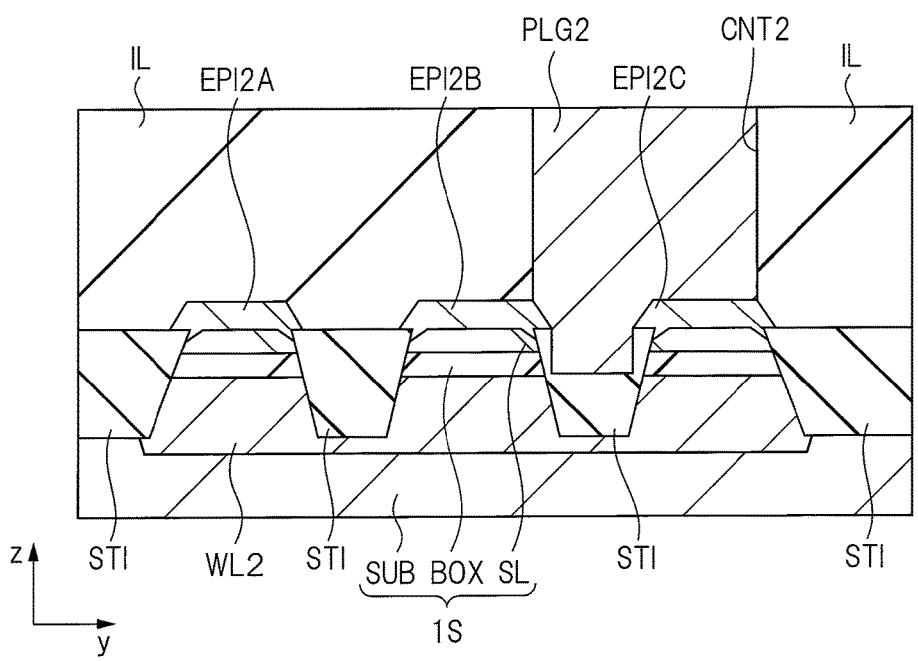
FIG. 26 is a cross-sectional view taken along a line A-A of FIG. 24.

Meanwhile, FIG. 26 is a cross-sectional view taken along a line A-A of FIG. 24. As shown in FIG. 26, in the second embodiment, a comb shape including a plurality of portions (EPI2A, EPI2B, and EPI2C) having a small width and arranged in parallel is formed. As a result, since the width of the plurality of portions (EPI2A, EPI2B, and EPI2C) constituting the comb shape and arranged in parallel becomes small in the gate width direction, the "flared structure" is not formed at the end portion of each of the plurality of portions (EPI2A, EPI2B, and EPI2C) arranged in parallel, but the "facet structure" is formed. Thus, even when the plug PLG2 is formed across the mutually separate portions constituting the comb shape and arranged in parallel as shown in FIG. 26, since the element isolation portion STI having a large thickness is formed between the portions arranged in parallel, the penetration of the plug PLG2 to the support substrate SUB (well WL2) is prevented. In the manner described above, according to the second embodiment, it is possible to improve the reliability of the semiconductor device including the field effect transistor Q2 formed in the active region having a width in a gate width direction (y direction) greater than a predetermined width.

Modification Example

Figure 27:
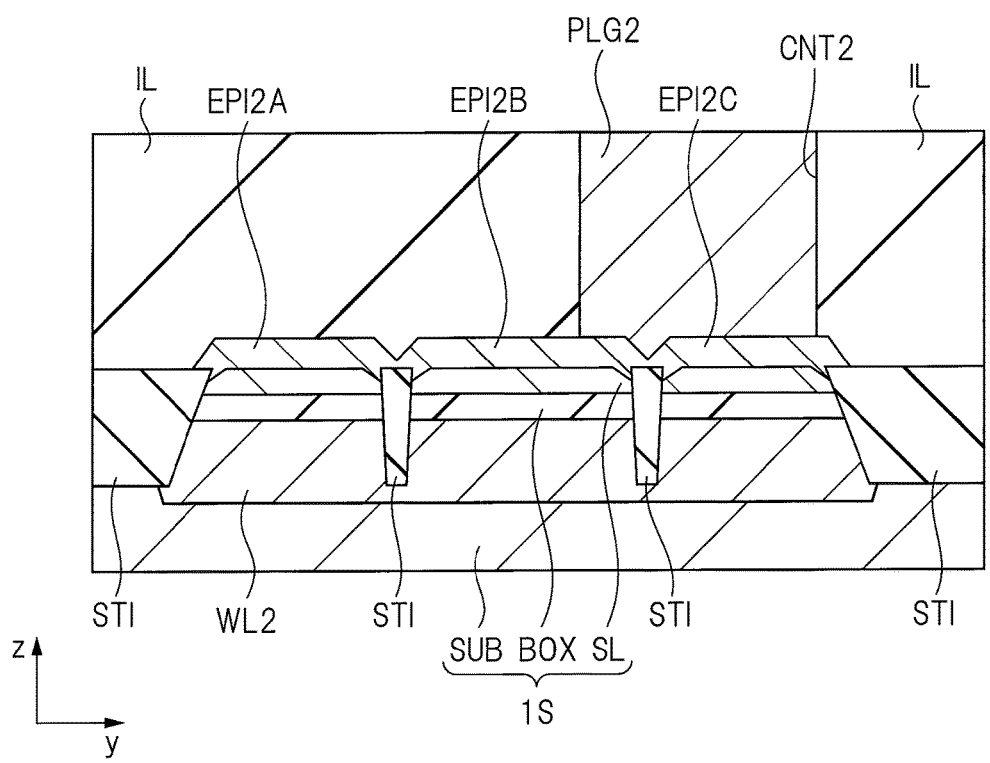
FIG. 27 is a cross-sectional view schematically showing a configuration of a semiconductor device according to a modification example.

Next, a modification example of the second embodiment will be described. FIG. 27 is a view schematically showing an arrow portion of an epitaxial layer according to the modification example. As shown in FIG. 27, in this modification example, a plurality of portions (EPI2A, EPI2B, and EPI2C) having a small width and arranged in parallel are formed. As a result, since each of the plurality of portions (EPI2A, EPI2B, and EPI2C) arranged in parallel has a small width, the "flared structure" is not formed at the end portion of each of the plurality of portions (EPI2A, EPI2B, and EPI2C) arranged in parallel, but the "facet structure" is formed. Further, as shown in FIG. 27, the plurality of portions (EPI2A, EPI2B, and EPI2C) arranged in parallel are coupled to each other. Accordingly, even when the plug PLG2 is formed across the plurality of portions arranged in parallel, the penetration of the plug PLG2 to the support substrate SUB (well WL2) is prevented. In particular, in this modification example, since the plurality of portions (EPI2A, EPI2B, and EPI2C) arranged in parallel are coupled to each other, the connection resistance between the plug PLG2 and the epitaxial layer can be advantageously reduced. As described above, according to this modification example, since the end portion of the epitaxial layer having a large width is divided into a plurality of portions (EPI2A, EPI2B, and EPI2C) having a small width and arranged in parallel and the plurality of portions (EPI2A, EPI2B, and EPI2C) arranged in parallel are coupled to each other, the penetration of the plug PLG2 to the support substrate SUB can be prevented while reducing the connection resistance between the plug PLG2 and the epitaxial layer. As a result, according to this modification example, it is possible to improve the reliability of the semiconductor device including the field effect transistor Q2 formed in the active region having a width in a gate width direction (y direction) greater than a predetermined width.

In the foregoing, the invention made by the inventors of the present invention has been concretely described based on the embodiments. However, it is needless to say that the present invention is not limited to the foregoing embodiments and various modifications and alterations can be made within the scope of the present invention.

The embodiment described above includes a following aspect.

APPENDIX 1

A semiconductor device comprising:

an SOI substrate comprised of a support substrate, a buried insulating layer formed on the support substrate, and a semiconductor layer formed on the buried insulating layer, and including an element isolation portion formed therein and an active region surrounded by the element isolation portion in a plan view;

an epitaxial layer formed on the semiconductor layer in the active region; and a plug connected to the epitaxial layer, wherein a width of the active region in a first direction is greater than 250 nm, and wherein a shortest distance between the element isolation portion and the plug in the first direction is greater than 60 nm.

What is claimed is:
1. A semiconductor device comprising:
an SOI substrate comprised of a support substrate, a buried insulating layer formed on the support substrate, and a semiconductor layer formed on the buried insulating layer, and including an element isolation portion formed therein, a first active region, and a second active region isolated from the first active region by the element isolation portion;
a first epitaxial layer formed on the semiconductor layer in the first active region;
a second epitaxial layer formed on the semiconductor layer in the second active region;
a first plug connected to the first epitaxial layer; and
a second plug connected to the second epitaxial layer,
wherein a width of the second active region in a first direction is greater than a width of the first active region in the first direction,
wherein a thickness of an end portion of the second epitaxial layer, which is in contact with the element isolation portion, is smaller than a thickness of an end portion of the first epitaxial layer, which is in contact with the element isolation portion, and
wherein a second shortest distance between the element isolation portion and the second plug in the first direction is greater than a first shortest distance between the element isolation portion and the first plug in the first direction.

2. The semiconductor device according to claim 1, wherein the width of the second active region is greater than 250 nm.

3. The semiconductor device according to claim 1, wherein the second shortest distance is 60 nm or greater.

4. The semiconductor device according to claim 1, wherein the second shortest distance is 90 nm or greater.

5. The semiconductor device according to claim 1, wherein the second epitaxial layer is present between the second plug and the element isolation portion in a plan view.

6. The semiconductor device according to claim 1, wherein a first field effect transistor including a gate electrode is formed in the first active region, and
wherein the first direction is a gate width direction.

7. The semiconductor device according to claim 6, wherein the first field effect transistor is a fully depleted transistor.

8. The semiconductor device according to claim 7, wherein a thickness of the semiconductor layer is 5 nm or greater and 20 nm or smaller, and
wherein a thickness of the buried insulating layer is 5 nm or greater and 20 nm or smaller.

9. A semiconductor device comprising:
an SOI substrate comprised of a support substrate, a buried insulating layer formed on the support substrate, and a semiconductor layer formed on the buried insulating layer, and including an element isolation portion formed therein and an active region surrounded by the element isolation portion in a plan view;
an epitaxial layer formed on the semiconductor layer in the active region; and
a plug connected to the epitaxial layer,
wherein the epitaxial layer includes:
a wide portion that has a first width in a first direction in a plan view; and
a plurality of narrow portions that have a second width smaller than the first width in the first direction in a plan view, are formed integrally with the wide portion, and are arranged in the first direction, and
wherein the plug is connected to at least one of the plurality of narrow portions.

10. The semiconductor device according to claim 9, wherein the plurality of narrow portions are arranged so as to be separated from each other in the first direction.

11. The semiconductor device according to claim 9, wherein the plurality of narrow portions are coupled to each other.

12. A method of manufacturing a semiconductor device comprising:
(a) preparing an SOI substrate comprised of a support substrate, a buried insulating layer formed on the support substrate, and a semiconductor layer formed on the buried insulating layer;
(b) forming an element isolation portion in the SOI substrate, thereby forming, in the SOI substrate, a first active region having a first width in a first direction and a second active region isolated from the first active region by the element isolation portion and also having a second width in the first direction greater than the first width;
(c) forming a first epitaxial layer on the semiconductor layer in the first active region and forming a second epitaxial layer on the semiconductor layer in the second active region by using an epitaxial growth method;
(d) forming an interlayer insulating film that covers the first epitaxial layer and the second epitaxial layer; and
(e) forming a first plug that penetrates through the interlayer insulating film to reach the first epitaxial layer and forming a second plug that penetrates through the interlayer insulating film to reach the second epitaxial layer,
wherein, in the step (c), a thickness of an end portion of the second epitaxial layer, which is in contact with the element isolation portion, is smaller than a thickness of an end portion of the first epitaxial layer, which is in contact with the element isolation portion, and
wherein, in the step (e), the first plug and the second plug are formed in the interlayer insulating film such that a second shortest distance between the element isolation portion and the second plug in the first direction is greater than a first shortest distance between the element isolation portion and the first plug in the first direction.

13. The method of manufacturing a semiconductor device according to claim 12,
wherein, in the step (c), gas containing $SiH_2Cl_2$, HCl, and $H_2$ is used, and film forming conditions that a pressure is 10 Pa or higher and 1000 Pa or lower and a temperature is 700° C. or higher and 800° C. or lower are used.

14. The method of manufacturing a semiconductor device according to claim 12,
wherein, in the step (c), gas containing $SiH_4$, HCl, and $H_2$ is used, and film forming conditions that a pressure is 10 Pa or higher and 1000 Pa or lower and a temperature is 500° C. or higher and 700° C. or lower are used.

15. The method of manufacturing a semiconductor device according to claim 12,
wherein, in the step (c), a film forming apparatus capable of processing a plurality of the SOI substrates at the same time is used, and
wherein an inner wall of the film forming apparatus is coated with silicon.

* * * * *